(12) United States Patent
Chetlur et al.

(10) Patent No.: US 10,943,976 B2
(45) Date of Patent: Mar. 9, 2021

(54) METAL-OXIDE SEMICONDUCTOR (MOS) DEVICE STRUCTURE BASED ON A POLY-FILLED TRENCH ISOLATION REGION

(71) Applicant: Allegro MicroSystems, LLC, Manchester, NH (US)

(72) Inventors: Sundar Chetlur, Bedford, NH (US); Maxim Klebanov, Manchester, NH (US); Washington Lamar, Mont Vernon, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/537,725

(22) Filed: Aug. 12, 2019

(65) Prior Publication Data

US 2019/0363162 A1 Nov. 28, 2019

Related U.S. Application Data

(62) Division of application No. 15/606,043, filed on May 26, 2017, now Pat. No. 10,468,485.

(51) Int. Cl.
*H01L 29/08* (2006.01)
*H01L 29/423* (2006.01)
(Continued)

(52) U.S. Cl.
CPC ........ *H01L 29/0847* (2013.01); *H01L 27/027* (2013.01); *H01L 27/088* (2013.01);
(Continued)

(58) Field of Classification Search
CPC ............. H01L 29/0847; H01L 29/0649; H01L 29/0688; H01L 29/4236; H01L 29/518;
(Continued)

(56) References Cited

U.S. PATENT DOCUMENTS

| 4,951,102 A | 8/1990 | Beitman et al. |
| 6,323,518 B1 | 11/2001 | Sakamoto et al. |

(Continued)

OTHER PUBLICATIONS

Notice of Allowance dated Jul. 31, 2019 for U.S. Appl. No. 15/606,043; 11 Pages.

(Continued)

*Primary Examiner* — Igwe U Anya
(74) *Attorney, Agent, or Firm* — Daly, Crowley, Mofford & Durkee, LLP

(57) ABSTRACT

A metal-oxide semiconductor (MOS) transistor structure is provided herein having one or more horizontal and/or one or more vertical MOS transistor structures formed around trench and liner isolation regions. The trench region serves as a gate electrode, while the liner is formed around the sidewalls of trench region and serves as a gate dielectric of a parasitic MOS within the transistor structure. The MOS transistor structure includes various doped regions formed around one or more portions of the trench and liner regions. The doped regions can have one or more different doping types such that in response to a voltage applied to the trench region, a channel region is formed in at least one of the doped regions and provides a current path within the MOS transistor between different doped regions.

20 Claims, 13 Drawing Sheets

(51) Int. Cl.
  *H01L 27/088* (2006.01)
  *H01L 29/78* (2006.01)
  *H01L 29/51* (2006.01)
  *H01L 29/06* (2006.01)
  *H01L 27/02* (2006.01)
  *H01L 21/8234* (2006.01)

(52) U.S. Cl.
  CPC ...... *H01L 29/0649* (2013.01); *H01L 29/0688* (2013.01); *H01L 29/4236* (2013.01); *H01L 29/518* (2013.01); *H01L 29/7827* (2013.01); *H01L 21/823412* (2013.01); *H01L 21/823487* (2013.01)

(58) Field of Classification Search
  CPC ......... H01L 29/7827; H01L 21/823412; H01L 21/823487
  USPC ........................................................ 257/334
  See application file for complete search history.

(56) References Cited

U.S. PATENT DOCUMENTS

| | | |
|---|---|---|
| 6,545,316 B1 | 4/2003 | Baliga |
| 6,800,509 B1 | 10/2004 | Lin et al. |
| 7,489,007 B2 | 2/2009 | Williams et al. |
| 7,960,781 B2 | 6/2011 | Loechelt et al. |
| 8,164,162 B2 | 4/2012 | Hsieh |
| 9,748,346 B2 | 8/2017 | Mallikarjunaswamy et al. |
| 2001/0023967 A1 | 9/2001 | Yoneda |
| 2006/0211264 A1* | 9/2006 | Kakoschke ..... H01L 21/823418 438/778 |
| 2008/0061367 A1* | 3/2008 | Williams .............. H01L 29/866 257/336 |
| 2008/0258224 A1 | 10/2008 | Hshieh |
| 2013/0092976 A1 | 4/2013 | Hsieh |
| 2017/0179109 A1 | 6/2017 | Toyoda et al. |
| 2018/0342500 A1 | 11/2018 | Chetlur et al. |

OTHER PUBLICATIONS

Office Action dated Jul. 10, 2018 for U.S. Appl. No. 15/606,043; 12 Pages.
Office Action dated Feb. 7, 2019 for U.S. Appl. No. 15/606,043; 10 Pages.
Response to Restriction Requirement dated Apr. 2, 2018 for U.S. Appl. No. 15/606,043, filed Apr. 11, 2018; 1 Page.
Response to Office Action dated Jul. 10, 2018 for U.S. Appl. No. 15/606,043, filed Sep. 25, 2018; 22 Pages.
Response to Office Action dated Feb. 7, 2019 for U.S. Appl. No. 15/606,043, filed Apr. 15, 2019; 15 Pages.
Restriction Requirement dated Apr. 2, 2018 for U.S. Appl. No. 15/606,043; 6 Pages.

* cited by examiner

METAL-OXIDE SEMICONDUCTOR (MOS) DEVICE STRUCTURE BASED ON A POLY-FILLED TRENCH ISOLATION REGION

CROSS REFERENCE TO RELATED APPLICATIONS

This application is a Divisional Application of and claims the benefit of and priority to U.S. patent application Ser. No. 15/606,043 filed May 26, 2017, which is incorporated herein by reference in its entirety.

BACKGROUND

As is known in the art, metal-oxide semiconductor field-effect transistor (MOSFET) is a type of FET and can include a gate, source and drain terminal and a semiconductor substrate. The gate can be electrically insulated from a n-channel or p-channel in the semiconductor substrate by a thin layer of insulating material. A voltage can be applied to the gate terminal to produce an electrical field and alter the flow of carriers through the n-channel or p-channel in the semiconductor substrate and thus the flow of carriers between the drain and source terminal.

SUMMARY

In accordance with the concepts, circuits and techniques described herein metal-oxide semiconductor (MOS) transistor structures are provided herein having one or more horizontal and/or one or more vertical MOS transistor structures formed around trench and liner isolation regions. The trench region serves as a gate electrode, while the liner is formed around the sidewalls of trench region and serves as a gate dielectric of a parasitic MOS within the transistor structure. In an embodiment, the trench region may include a polysilicon filler and the liner may include an oxide liner.

A gate bias can be applied to the trench region and induce an electrostatic field in a silicon bulk layer immediately adjacent to the liner sidewall and modulate the conductivity of the silicon bulk. A combination of diffusion profiles may be formed in the silicon bulk layer along the liner sidewall to form a channel region in the silicon bulk layer and thus form a drain-channel-source structure within the transistor structure. In an embodiment, the drain-channel-source structure can act as a MOS transistor structure responsive to the application of the gate bias applied to the trench region electrode.

The channel region may be formed responsive to the gate bias being applied by a direct coupling to the trench region, or by a capacitive coupling to the trench region. A voltage threshold of the MOS transistor may be based at least in part on the properties of the trench region, liner and/or channel region (e.g., doping level).

The MOS transistor structure may be used as a power MOS transistor for high current applications. In some embodiments, the MOS transistor structure can be used as an electrostatic discharge (ESD) clamp.

The systems described herein may include one or more of the following features independently or in combination with another feature.

In a first aspect, a transistor structure includes a first doped region, a second doped region extending into the first doped region, a third doped region extending into the second doped region, a trench region extending into the first doped region, the second doped region, and the third doped region, a liner disposed between the trench region and each of the first doped region, the second doped region, and the third doped region and a channel region formed in the second doped region, responsive to a voltage applied to the trench region, the channel providing a current path from the first doped region to the third doped region.

The first doped region may comprise a first N-type region, the second doped region may comprise a first P-type region extending into the first N-type region, the third doped region may comprise a second N-type region extending into the first P-type region, the trench region extending into the second N-type region, the first P-type region, and the first N-type region, the liner disposed between the trench region and each of the second N-type region, the first P-type region, and the first N-type region and the channel region formed in the first P-type region, responsive to a voltage applied to the trench region, the channel providing a current path from the second N-type region to the first N-type region.

The liner region may include a first surface and a second surface, the first surface in contact with the trench region and wherein the channel region is formed adjacent to the second surface. The voltage can be greater than a voltage threshold of the transistor structure, and wherein the voltage threshold is based on at least one of a material in the channel region, a doping level of the channel region, a material of the liner, a thickness of the liner, a material of the trench region and a doping level of the trench region.

In some embodiments, the transistor structure includes a first node formed over the trench region, a second node formed over the second N-type region, a third node formed over the first P-type region and a fourth node formed over the first N-type region. The first node can be coupled to a gate terminal, the second node can be coupled to a source terminal, the third node can be coupled to a body terminal and the fourth node can be coupled to a drain terminal. The current path can form a drain-channel-source structure of a metal-oxide-semiconductor (MOS) transistor within the transistor structure.

The trench region layer may comprise polysilicon. The liner can form a gate dielectric of the transistor structure. In an embodiment, the liner includes at least one of silicon dioxide or silicon nitride.

The transistor structure may comprise one or more horizontal metal-oxide-semiconductor (MOS) transistor structures, one or more vertical MOS transistor structures or a combination of both formed adjacent to the second surface of the liner. The one or more horizontal MOS transistor structures or one or more vertical MOS transistor structures may be coupled to different portions of the second surface of the liner. In some embodiments, multiple horizontal MOS transistor structures or multiple vertical MOS transistor structures may be formed adjacent to the same portion of the second surface of the liner to form cascaded MOS transistor structures.

One or more portions of the liner may have a different thickness from one or more different portions to provide the multiple horizontal MOS transistor structures or the multiple vertical MOS transistor structures with varying thresholds.

In an embodiment, a dielectric layer can be formed over the trench region and a coupling electrode can be formed over the dielectric layer such that the dielectric layer and the coupling electrode are disposed between the first node and the trench region. In some embodiments, the first node can be capacitively coupled to the fourth node using the coupling electrode to form an electrostatic discharge clamp.

A source terminal of a first MOS transistor structure can be coupled to a drain terminal of a second MOS transistor structure to form a cascaded MOS transistor structure.

In some embodiments, the first doped region may comprise a first P-type region, the second doped region may comprise a first N-type region extending into the first P-type region, the third doped region may comprise a second P-type region extending into the first N-type region, the trench region can extend into the second P-type region, the first N-type region, and the first P-type region, the liner can be disposed between the trench region and each of the second P-type region, the first N-type region, and the first P-type region and the channel region can be formed in the first N-type region, responsive to a voltage applied to the trench region (e.g., bias voltage), the channel providing a current path from the second P-type region to the first P-type region. In some embodiments, the voltage may be applied to a gate terminal coupled to the trench region.

The liner region has a first surface and a second surface, the first surface can be in contact with the trench region and wherein the channel region is formed adjacent to the second surface. The voltage can be greater than a voltage threshold of the transistor structure. In some embodiments, the voltage threshold can be based on at least one of a material in the channel region, a doping level of the channel region, a thickness of the liner, a material of the liner, a material of the trench region or a doping level of the trench region.

The transistor structure may further comprise a first node formed over the trench region, a second node formed over the second P-type region, a third node formed over the first N-type region and a fourth node formed over the first P-type region. The first node can be coupled to a gate terminal, the second node can be coupled to a source terminal, the third node can be coupled to a body terminal and the fourth node can be coupled to a drain terminal. The current path forms a drain-channel-source structure of a metal-oxide-semiconductor (MOS) transistor within the transistor structure.

In another aspect, a transistor structure includes a buried layer, a first doped region extending into the buried layer, a second doped region extending into the first doped region, a third doped region extending into the second doped region, a fourth doped region extending into the second doped region, a plug region extending into the buried layer, a fifth doped region extending into the plug region, a trench region extending into the third doped region, the second doped region, the first doped region, and the buried layer, a liner disposed between the trench region and each of the third doped region, the second doped region, the first doped region, and the buried layer and a channel region formed in the second doped region, responsive to a voltage applied to the trench region, the channel providing a current path from the third doped region to the buried layer.

In some embodiments, the buried layer includes an N-type buried layer, the first doped region includes a first N-type region extending into the N-type buried layer, the second doped region includes a first P-type region extending into the first N-type region, the third doped region includes a second N-type region extending into the first P-type region, the fourth doped region includes a second P-type region extending into the first P-type region, the plug region includes a third N-type region, the fifth region includes a fourth N-type region extending into the plug region, the trench region extending into the second N-type region, the first P-type region, the first N-type region, and the N-type buried layer, the liner disposed between the trench region and each of the second N-type region, the first P-type region, the first N-type region, and the N-type buried layer and the channel region formed in the first P-type region, responsive to a voltage applied to the trench region, the channel providing a current path from the second N-type region to the N-type buried layer.

The trench region may comprise polysilicon. The liner region can have a first surface and a second surface with the first surface in contact with the trench region and wherein the channel region is formed adjacent to the second surface.

In some embodiments, the voltage is greater than a voltage threshold of the transistor structure. The voltage threshold can be based on at least one of a material in the channel region, a doping level of the channel region, a thickness of the liner, a material of the liner, a material of the trench region or a doping level of the trench region.

A first node can be formed over the trench region, a second node can be formed over the second N-type region, a third node can be formed over the second P-type region and a fourth node can be formed over the fourth N-type region. The first node can be coupled to a gate terminal, the second node can be coupled to a source terminal, the third node can be coupled to a body terminal and the fourth node can be coupled to a drain terminal. The current path can form a drain-channel-source structure of a metal-oxide-semiconductor (MOS) transistor within the transistor structure.

The transistor structure may further comprise a dielectric layer formed over the trench region and a coupling electrode formed over the dielectric layer, a first node formed over the coupling electrode, a second node formed over the second N-type region, a third node formed over the second P-type region and a fourth node formed over the fourth N-type region. The first node can be coupled to a gate terminal, the second node can be coupled to a source terminal, the third node can be coupled to a body terminal and the fourth node can be coupled to a drain terminal. The current path can form a drain-channel-source structure of a metal-oxide-semiconductor (MOS) transistor within the transistor structure.

In some embodiments, the first node can be capacitively coupled to the fourth node using the coupling electrode to form an electrostatic discharge clamp. The liner can form a gate dielectric of the transistor structure.

The transistor structure may comprise one or more horizontal metal-oxide-semiconductor (MOS) transistor structures, one or more vertical MOS transistor structures or a combination of both formed adjacent to the second surface of the liner. The one or more horizontal MOS transistor structures or one or more vertical MOS transistor structures may be coupled to different portions of the second surface of the liner.

The transistor structure may further comprise a field oxide region and portions of the field oxide region can extend into the first P-type region and the first N-type region. The field oxide region can be formed adjacent to the second P-type region and the fourth N-type region. The field oxide region may comprise at least one of a shallow trench isolation (STI) region or a local oxidation of silicon (LOCOS) region.

In some embodiments, a third P-type region can be formed between the first P-type region and the first N-type region. The channel region can be formed in the first P-type region and the third P-type region, responsive to the voltage applied to the trench region. A fifth N-type region can be formed in the first P-type region such that it is disposed between the second N-type region and the third P-type region and adjacent to the liner. The transistor structure may further comprise a sixth N-type region formed in the first P-type region such that it is disposed between the second N-type region and the third P-type region and adjacent to the liner.

In some embodiments, the buried layer may comprise a P-type buried layer, the first doped region may comprise a first P-type doped region extending into the P-type buried layer, the second doped region may comprise a first N-type region extending into the first P-type region, the third doped region may comprise a second P-type region extending into the first N-type region, the fourth doped region may comprise a second N-type region extending into the first N-type region, the plug region may comprise a third P-type region, the fifth doped region may comprise a fourth P-type region extending into the plug region, the field oxide region can extend into the second P-type region, the first N-type region, the first P-type region and the P-type buried layer, the liner can be disposed between the field oxide region and each of the second P-type region, the first N-type region, the first P-type region and the P-type buried layer, and the channel region can be formed in the first N-type region, responsive to a voltage applied to the trench region, the channel providing a current path from the second P-type region to the first P-type region.

The transistor structure may further comprise a dielectric layer formed over the trench region and a coupling electrode formed over the dielectric layer, a first node formed over the coupling electrode, a second node formed over the second P-type region, a third node formed over the second N-type region and a fourth node formed over the fourth P-type region.

The first node can be coupled to a gate terminal, the second node can be coupled to a source terminal, the third node can be coupled to a body terminal and the fourth node can be coupled to a drain terminal. The current path may form a drain-channel-source structure of a metal-oxide-semiconductor (MOS) transistor within the transistor structure.

The transistor structure may further comprise a field oxide region such that portions of the field oxide region extend into the second N-type region and the first P-type region. The field oxide region can be formed adjacent to the second N-type region and the fourth P-type region. The field oxide region may comprise at least one of a shallow trench isolation (STI) region or a local oxidation of silicon (LOCOS) region.

In another aspect, a transistor structure includes a first doped region, a second doped region extending into the first doped region, a third doped region extending into the second doped region, a fourth doped region extending into the third doped region, a fifth doped region extending into the fourth doped region, a sixth doped region extending into the fourth doped region, a trench region extending into the fifth, fourth, third, second and first doped regions, a liner disposed between the trench region and each the fifth, fourth, third, second and first doped regions and a channel region formed in the fourth doped region, responsive to a voltage applied to the trench region, the channel providing a current path from the fifth doped region to the second doped region.

In some embodiments, the first doped region includes a first N-type region, the second doped region includes a first P-type region extending into the first N-type region, the third doped region includes a second P-type region extending into the first P-type region, the fourth doped region includes a second N-type region extending into the second P-type region, the fifth doped region includes a third P-type region extending into the second N-type region, and the sixth doped region includes a third N-type region extending into the second N-type region.

The liner region can have a first surface and a second surface, with the first surface in contact with the trench region and wherein the channel region is formed adjacent to the second surface. The voltage can be greater than a voltage threshold of the transistor structure. The voltage threshold can be based on at least one of a material in the channel region, doping level of the channel region, a thickness of the liner, a material of the liner, a material of the trench region and a doping level of the trench region.

In some embodiments, the transistor structure further includes a fourth N-type region formed between the second P-type region and a fourth P-type region, a first field oxide region formed over the fourth N-type region, a fifth P-type region extending into the fourth P-type region, a sixth P-type region extending into the fifth P-type region, a plug region formed adjacent to the fourth, fifth and sixth P-type regions, a fifth N-type region formed over the plug region, and a second field oxide region formed such that portions of the second field oxide region extend into the fifth P-type region and the plug region.

A first node can be formed over the trench region, a second node can be formed over the third P-type region, a third node can be formed over the third N-type region, a fourth node can be formed over the sixth P-type region and a fifth node can be formed over the fifth N-type region. In some embodiments, the first node can be coupled to a gate terminal, the second node can be coupled to a source terminal, the third node can be coupled to a body terminal, the fourth node can be coupled to a drain terminal, and the fifth node can be coupled to a tub terminal. The current path can form a drain-channel-source structure of a metal-oxide-semiconductor (MOS) transistor within the transistor structure.

The transistor structure may further comprise a dielectric layer formed over the trench region and a coupling electrode formed over the dielectric layer, a first node formed over the coupling electrode, a second node formed over the third P-type region, a third node formed over the third N-type region, a fourth node formed over the sixth P-type region, and a fifth node formed over the fifth N-type region. The first node can be coupled to a gate terminal, the second node can be coupled to a source terminal, the third node can be coupled to a body terminal, the fourth node can be coupled to a drain terminal, and the fifth node can be coupled to a tub terminal. The current path can form a source-channel-drain structure of a metal-oxide-semiconductor (MOS) transistor within the transistor structure.

The first N-type region and the plug region may form a continuous N-type well and form an electrical isolation barrier for the transistor structure.

In some embodiments, the second P-type region includes the fourth N-type region such that the second surface of the liner is adjacent to each of the third P-type region, the second N-type region, the fourth N-type region, the first P-type region and the first N-type region. The second N-type region may comprise the fourth N-type region such that the second surface of the liner is adjacent to each of the third P-type region, the fourth N-type region, the second P-type region, the first P-type region and the first N-type region. In other embodiments, the second N-type region and the second P-type region may comprise the fourth N-type region such that the second surface of the liner is adjacent to each of the third P-type region, the fourth N-type region, the first P-type region and the first N-type region. The first and second field oxide regions may comprise at least one of a shallow trench isolation (STI) region or a local oxidation of silicon (LOCOS) region.

In another aspect, a transistor structure includes a first doped region, a second doped region extending into the first doped region, a third doped region extending into the second doped region, a trench region extending into the first doped region, the second doped region, and the third doped region, a means for forming a dielectric disposed between the trench region and each of the first doped region, the second doped region, and the third doped region; and a means for providing a current path formed in the second doped region, responsive to a voltage applied to the trench region, wherein the means for providing the current path forms a path from the first doped region to the third doped region.

In some embodiments, the first doped region includes a first N-type region, the second doped region includes a first P-type region extending into the first N-type region, the third doped region includes a second N-type region extending into the first P-type region, and the trench region extending into the second N-type region, the first P-type region, and the first N-type region.

The means for forming a dielectric can have a first surface and a second surface such that the first surface is in contact with the trench region and the channel region is formed adjacent to the second surface. The means for providing the current path may further includes a drain-channel-source structure of a metal-oxide-semiconductor (MOS) transistor formed within the transistor structure.

It should be appreciated that elements of different embodiments described herein may be combined to form other embodiments not specifically set forth above. Various elements, which are described in the context of a single embodiment, may also be provided separately or in suitable combination. Other embodiments, not specifically described herein are also within the scope of the following claims.

The details of one or more embodiments of the disclosure are set forth in the accompanying drawings and the description below. Other features, objects, and advantages of the disclosure will be apparent from the description and drawings, and from the claims.

DETAILED DESCRIPTION

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall-effect element, a magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

In accordance with the concepts, circuits and techniques described herein a metal-oxide semiconductor (MOS) transistor structure is provided herein having one or more horizontal and/or one or more vertical MOS transistor structures formed around trench and liner isolation regions. The trench region serves as a gate electrode, while the liner is formed around the sidewalls of trench region and serves as a gate dielectric of a parasitic MOS within the transistor structure. The MOS transistor structure includes various doped regions formed around one or more portions of the trench and liner regions. The doped regions can have one or more different doping types such that in response to a voltage applied to the trench region, a channel region is formed in at least one of the doped regions and provides a current path within the MOS transistor between different doped regions.

Figure 1:
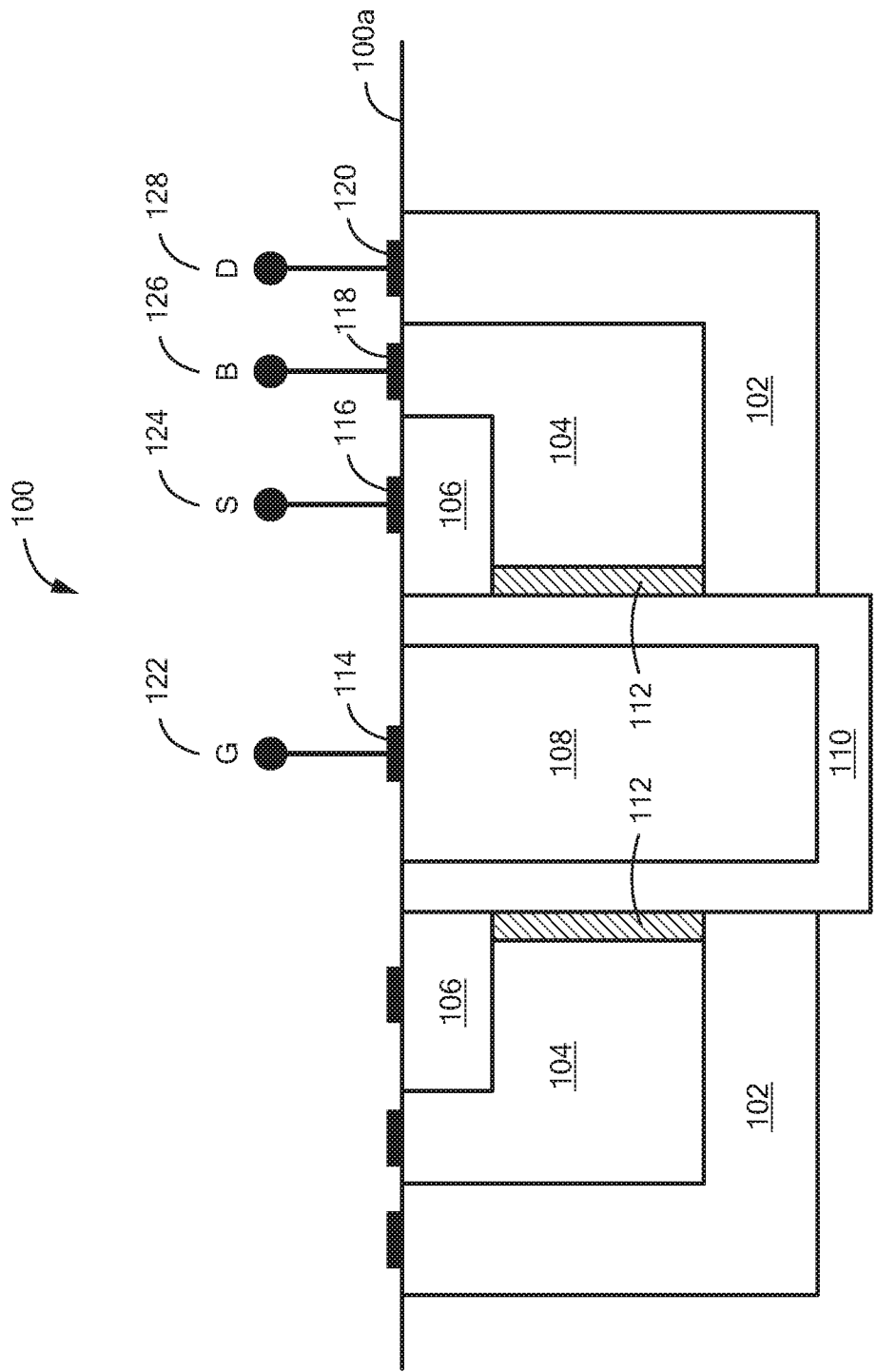
FIG. 1 is a cross-section of a trench isolation based N-type metal-oxide-semiconductor (NMOS) transistor structure.

Referring to FIG. 1, a trench based transistor structure 100 includes a first N-type region 102, a first P-type region 104 extending into the N-type region 102 and a second N-type region 106 extending into the first P-type region 104. Each of first N-type region 102, first P-type region 104 and second N-type region 106 can be formed such that a portion of each region is exposed along a first surface 100a of transistor 100.

It should be appreciated that each of the doped regions as described herein may include either a N-type or P-type doped region of varying doping levels. For example, N-type regions may refer to at least one of an N(+) type region, an N(-) type region, N-type well or N-type epitaxial layer. P-type regions may refer to at least one of a P(+) type region, a P(-) type region, P-type well or P-type epitaxial layer. The type of region formed and/or the level of doping of the respective region can be based at least in part on a particular application of the respective transistor structure.

A trench region 108 is formed in transistor 100 such that it extends through each of first N-type region 102, first P-type region 104 and second N-type region 106. A liner 110 is formed around trench region 108 and forms a barrier between trench region 108 and each of first N-type region 102, first P-type region 104 and second N-type region 106.

In one embodiment, trench region 108 and liner 110 can be formed in a generally middle portion of transistor 100 such that first N-type region 102, first P-type region 104 and second N-type region 106 are provided on at least two sides 110c, 110d of liner 110. However, it should be appreciated that the position of trench region 108 and liner 110 can vary based at least in part on a particular application of transistor 100.

Trench region 108 may include a deep trench isolation (DTI) region. Deep trench isolation is a technique that can be used in the fabrication of integrated circuits to provide electrical isolation between the neighboring regions or integrated circuit. For example, in some embodiments, a deep vertical hole can be etched in a substrate and/or different layers (here first N-type region 102, first P-type region 104 and second N-type region 106) from a surface (first surface 100a) down to a desired depth and then filled with dielectric materials or a combination of dielectric materials (e.g., liner 110) with semiconductor materials (e.g., polysilicon). The dielectric materials can provide an electrical isolation function between the neighboring regions or integrated circuit.

A first node 114 is formed over trench region 108 and may be coupled to a gate terminal (G) 122. The first node can be directly coupled to trench region 108 and thus gate terminal 122 can be directly coupled to trench region 108. A second node 116 is formed over second N-type region 106 and may be coupled to a source terminal (S) 124. A third node 118 is formed over first P-type region 104 and may be coupled to a body terminal (B) 126. A fourth node 120 is formed over first N-type region 102 and may be coupled to a drain terminal (D) 128.

Trench region 108 and liner 110 can be formed into the different layers of transistor structure 100 such that the trench region 108 forms a gate electrode and liner 110 forms a gate dielectric of a parasitic metal-oxide semiconductor (MOS) type structure. In an embodiment, transistor structure 100 can be formed as a p-channel MOS (PMOS) structure or an n-channel MOS (NMOS) structure (here an NMOS structure).

For example, and as illustrated in FIG. 1, the stack of first N-type region 102, first P-type region 104 and second N-type region 106 can form a source-body-drain structure of the MOS transistor.

In operation, responsive to a voltage applied to trench region 108, a channel region 112 is formed in first P-type region 104. Channel region 112 may provide a current path from second N-type region 106 to first N-type region 102. For example, the voltage can be a positive bias above a voltage threshold of transistor 100 and form an electrostatic field inside first P-type region 104 and cause an inversion of the conductivity to first N-type region 102 and second N-type region 106, resulting in a turn on of the enhancement of the MOS transistor (here a NMOS transistor). In some embodiments, the bias voltage may be applied to a gate terminal coupled to the trench region.

In an embodiment, the voltage threshold can be a turn-on voltage to transition transistor from a depletion mode to an enhancement mode. The voltage threshold of transistor 100 can be a function of one or more of the following: a material in channel region 112, a doping level of channel region 112, a material of liner 110, a thickness of liner 110, a material of trench region 108 and/or a doping level of trench region 108. Thus, the turn-on voltage (i.e., voltage threshold) can be modified by adjusting one or more of: a material in channel region 112, a doping level of channel region 112, a thickness of liner 110, a material of trench region 108 and a doping level of trench region 108.

In some embodiments, channel region 112 may correspond to a current path of an electrostatic discharge (ESD) device. For example, in response to an ESD event, a bipolar transistor (here NPN) may turn on or otherwise be activated in transistor 100 and form a current path (i.e., channel region 112) from second N-type region 106 to first N-type region 102 through first P-type region 104. The ESD event may occur at the source terminal 124 and/or the drain terminal 128 and may deliver a spike or high amount of energy. Channel region 112 may provide a safe path for current from the ESD event to flow away from circuitry that transistor 100 may be coupled to, for example, when transistor 100 is disposed within an integrated circuit (IC).

In one embodiment of transistor 100, first N-type region 102 includes an N-type doped drain region, first P-type region 104 includes a P-type doped body region and second N-type region 106 includes a N-type source region. However, it should be appreciated that each of the layers may be formed having different doping levels.

In the illustrative embodiment of FIG. 1, transistor structure 100 is described above having an n-channel metal-oxide-semiconductor (NMOS) configuration. However, it should be appreciated that transistor structure 100 may be provided having a p-channel metal-oxide-semiconductor (PMOS) configuration (e.g., FIG. 8A, FIGS. 9-12).

It should be appreciated that the different regions of transistor 100 is illustrated in FIG. 1 as having a vertical structure with respect to trench region 108 to from a vertical transistor. However, in other embodiments, the regions of transistor may be formed around trench region 108 having a horizontal structure and thus form a horizontal transistor.

In some embodiments, multiple horizontal and/or vertical transistor structures can be formed to provide a cascaded MOS transistor structure. For example, and now referring to FIG. 2, a cascaded trench isolation based transistor structure 200 includes a third N-type region 132 and a second P-type region 134 combined with first N-type region 102, first P-type region 104 and second N-type region 106 to form cascaded MOS transistor 200.

Figure 2:
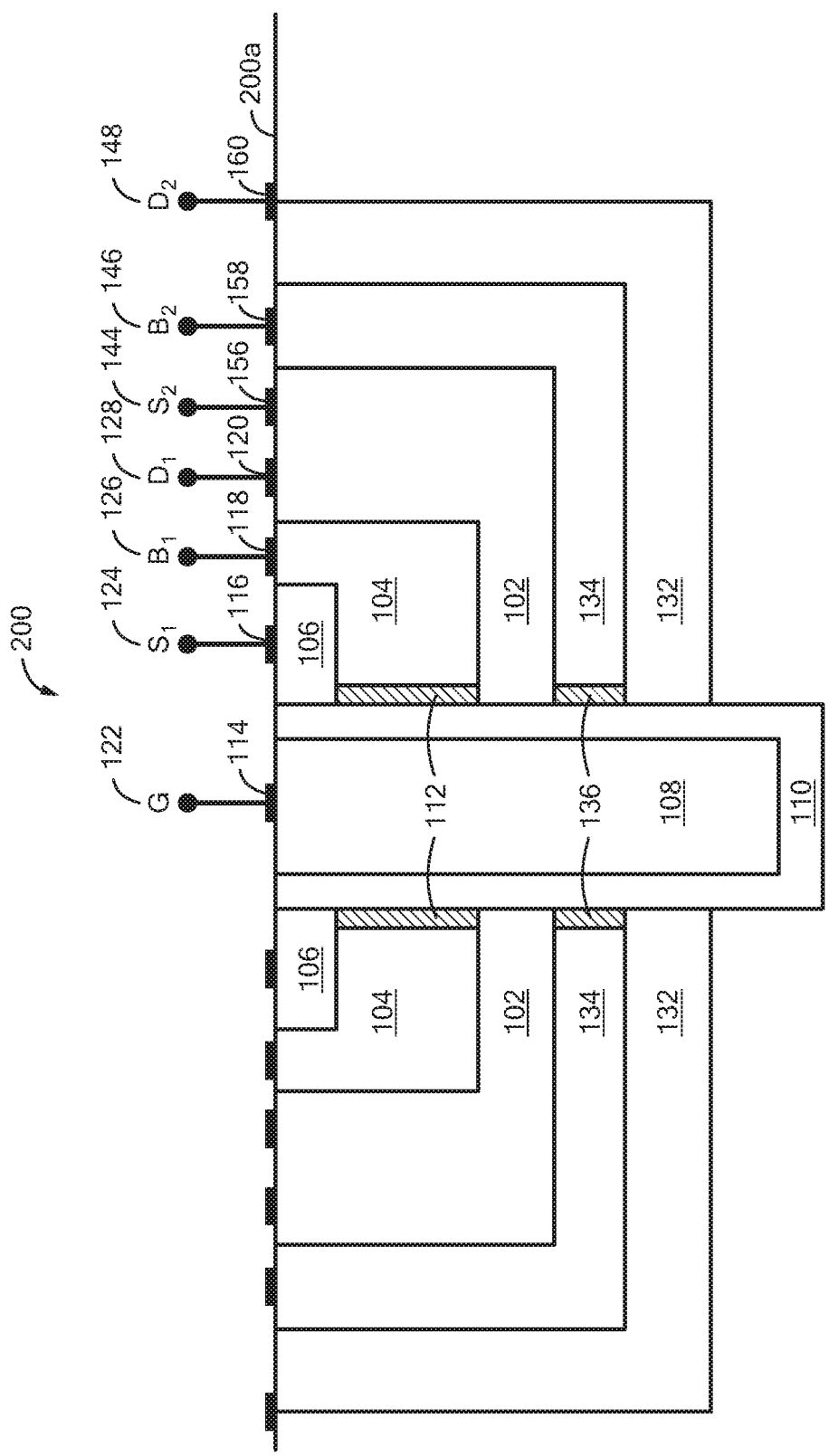
FIG. 2 is a block diagram of a trench isolation based cascaded NMOS transistor structure.

In the illustrative embodiment of FIG. 2, cascaded MOS transistor 200 includes third N-type region 132, second P-type region 134 extending into third N-type region 132, first N-type region 102 extending into second P-type region 134, first P-type region 104 extending into first N-type region 102 and second N-type region 106 extending into first P-type region 104.

Each of third N-type region 132, second P-type region 134, first N-type region 102, first P-type region 104, and second N-type region 106 can be formed such that a portion of each region is exposed along a first surface 200a of transistor 200.

Trench region 108 is formed in transistor 200 such that it extends through each of third N-type region 132, second P-type region 134, first N-type region 102, first P-type region 104, and second N-type region 106. Liner 110 is formed around trench region 108 such that it forms a barrier between trench region 108 and each of third N-type region 132, second P-type region 134, first N-type region 102, first P-type region 104, and second N-type region 106. In an embodiment, transistor 200 may be similar to transistor 100 of FIG. 1, however transistor 200 includes an additional N-type region and P-type region to form cascaded MOS transistor 200 (here a cascaded vertical MOS transistor).

In cascaded MOS transistor 200, multiple source, body and drain terminals may be formed. For example, first node 114 is formed over trench region 108 and may be coupled to gate terminal (G) 122. Second node 116 is formed over second N-type region 106 and may be coupled to first source terminal (S1) 124. Third node 118 is formed over first P-type region 104 and may be coupled to first body (B1) terminal 126. Fourth node 120 is formed over first N-type region 102 and may be coupled to first drain (D1) terminal 128.

A fifth node 156 is formed over first N-type region 102 and may be coupled to a second source terminal (S2) 144. Thus, first N-type region 102 may be provided as a drain and source terminal. In some embodiments, in the cascaded MOS transistor, the drain of the first MOS transistor may be coupled to the source of the second MOS transistor. In other embodiments, in the cascaded MOS transistor, the source of the first MOS transistor may be coupled to the drain of the second MOS transistor. A sixth node 158 is formed over second P-type region 134 and may be coupled to a second body terminal (B2) 146. A seventh node 160 is formed over third N-type region 132 and may be coupled to a second drain terminal (D2) 148.

In cascaded MOS transistor 200, multiple channel regions may be formed responsive to a gate bias applied to trench region 108. For example, responsive to the gate bias, a first channel region 112 may form in first P-type region and a second channel region 136 may form in second P-type region 134. Channel region 112 may provide a current path from second N-type region 106 to first N-type region 102 and channel region 136 may provide a current path from first N-type region 102 to second N-type region 132.

In some embodiments, cascaded MOS transistors may be used for applications requiring higher drain to source voltages (i.e., $BV_{DSS}$). For example, the cascaded MOS transistors may form one or more electrostatic discharge (ESD) clamp and be included within an integrated circuit having additional circuitry (also referred to herein as a circuit arrangement). The cascaded MOS transistors may be disposed across an input, output or both of the integrated circuit to protect the additional circuitry from an ESD event (e.g., a spike or high amount of energy delivered to the IC though the input, output or both). For example, in some embodiments, a circuit arrangement can be disposed between a first ESD clamp of the one or more ESD clamps and a second ESD clamp of the one or more ESD clamps such that a first terminal of the first ESD clamp is coupled to an input of the circuit arrangement and a first terminal of the second ESD clamp is coupled to an output of the circuit arrangement. The one or more ESD clamps may need to stay off (i.e., not operate) during normal operation of the protected integrated circuit. The maximum operating voltage of the integrated circuit may be higher than the $BV_{DSS}$ of at least one of the MOS transistors forming the cascaded MOS transistor, thus stacking of two or more may be used. In other embodiments, the cascaded MOS transistors may be used for ESD applications, such as but not limited to having an individual control over when to turn on one or more MOS transistors in the respective cascaded MOS transistor, upper or lower transistor.

It should be appreciated that the additional circuitry described above may include a circuit arrangement having one or more complementary metal oxide semiconductor (CMOS) devices, one or more bipolar devices, one or more-double diffused metal oxide semiconductor (DMOS) devices, one or more magnetic field sensing elements or a combination of CMOS devices, bipolar devices, DMOS devices and/or magnetic field sensing elements. The one or more magnetic field sensing elements may include one or more Hall-effect elements or magnetoresistance elements. The one or more magnetoresistance element may include at least one of an Indium Antimonide (InSb) element, a giant magnetoresistance (GMR) element, an anisotropic magnetoresistance (AMR) element, a tunneling magnetoresistance (TMR) element or a magnetic tunnel junction (MTJ) element.

In one embodiment of transistor 200, first N-type region 102 includes an N-type doped drain region, first P-type region 104 includes a P-type doped body region, second N-type region 106 includes a N-type source region, third N-type region 132 includes a N-type drain region and second P-type region 134 includes a P-type body region. However, it should be appreciated that each of the layers may be formed having different doping levels.

Figure 3:
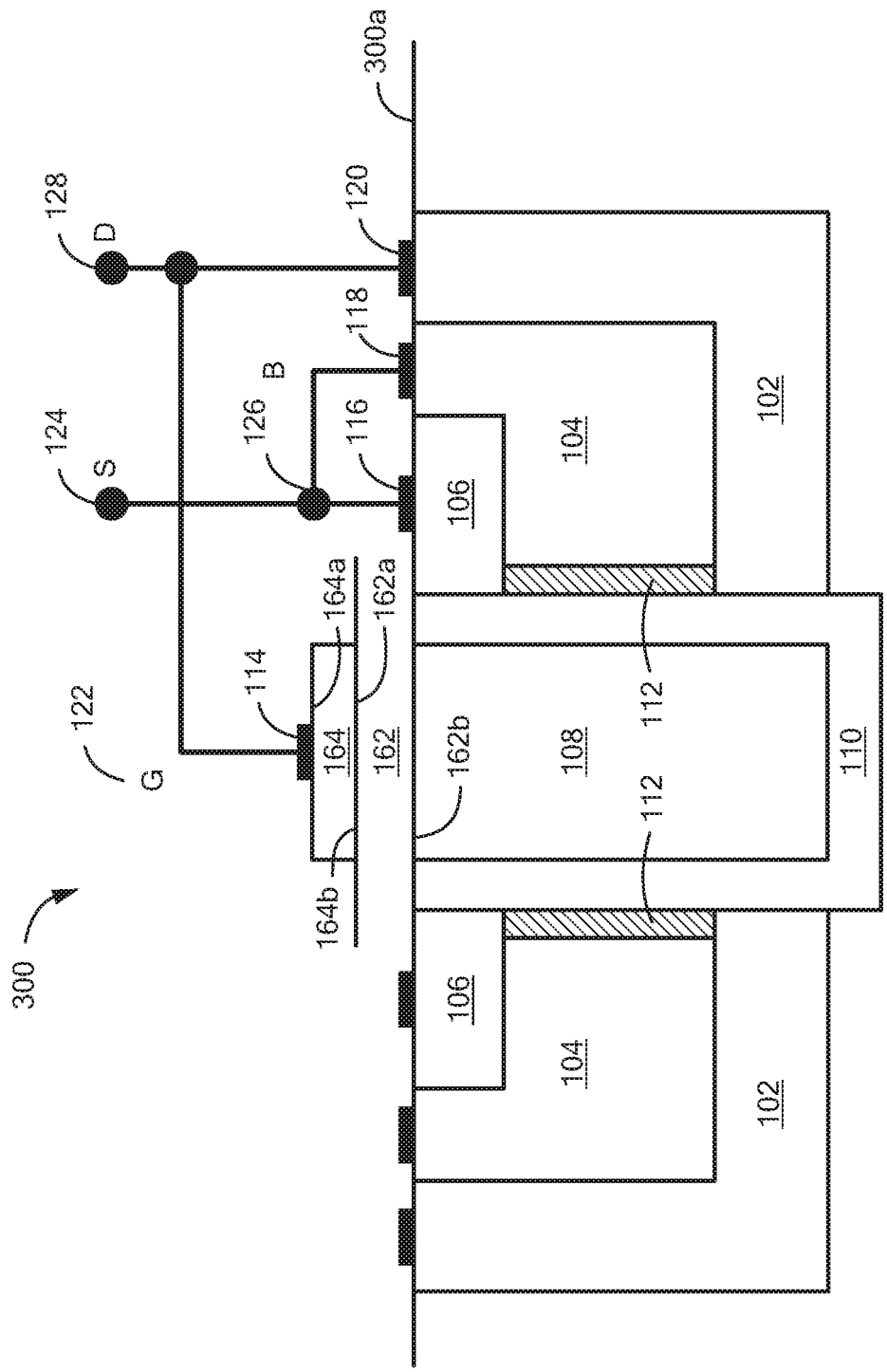
FIG. 3 is a block diagram of a trench isolation based NMOS transistor structure having a capacitively coupled gate connection.

Now referring to FIG. 3, a transistor structure 300 includes first N-type region 102, first P-type region 104 extending into first N-type region 102 and second N-type region 106 extending into the first P-type region 104. Each of first N-type region 102, first P-type region 104 and second N-type region 106 can be formed such that a portion of each region is exposed along a first surface 300a of transistor 300.

Trench region 108 is formed in transistor 300 such that it extends through each of first N-type region 102, first P-type region 104 and second N-type region 106. Liner 110 is formed around trench region 108 such that it forms a barrier between trench region 108 and each of first N-type region 102, first P-type region 104 and second N-type region 106.

Transistor 300 of FIG. 3 may be similar to transistor structure 100 of FIG. 1, however a gate connection to trench region 108 is provided through a capacitive coupling using a dielectric layer 162 and a coupling electrode 164.

For example, dielectric layer 162 may have a first surface 162a and a second, opposing surface 162b. The second surface 162b may be formed over trench region 108. Coupling electrode 164 may have a first surface 164a and a second, opposing surface 164b. The second surface 164b of coupling electrode 164 is formed over the first surface 162a of dielectric layer 162. Dielectric layer 162 and coupling electrode 164 are disposed between trench region 108 and first node 114, with first node 114 provided as a gate terminal of transistor structure 300. Thus, dielectric layer 162 and coupling electrode 164 form a capacitively coupled gate connection.

In some embodiments, first node 114 (i.e., gate terminal 122) may be coupled to fourth node 120 (i.e., drain terminal 128) to form an ESD clamp within transistor 300. Second node 116 (i.e., source terminal 124) may be coupled to third node 118 (i.e., body terminal 126).

In other embodiments, trench region 108 may be directly coupled to first node 114. For example, first node 114 may be formed on a surface of trench region 108 and first node 114 may be provided as a gate terminal of transistor structure 300.

In some embodiments, capacitive coupling may be implemented to provide gate control in trench based MOS transistors used as an ESD clamp for high voltage applications. The capacitive coupling between trench region 108 and first node 114 may increase a voltage threshold and thus a trigger voltage of transistor 300. For example, the capacitive coupling is a form of indirect coupling that can be weaker than a direct coupling (e.g., FIG. 1, FIG. 2). Thus, a larger gate bias may be needed to form an electrostatic field inside first P-type region 104 and cause an inversion of the conductivity to first N-type region 102 and second N-type region 106, resulting in a turn-on of the enhancement of the transistor 300. The capacitive coupling may be used in applications when transistor 300 is used as an ESD clamp, such as for high voltage applications.

In one embodiment of transistor 300, first N-type region 102 includes an N-type doped drain region, first P-type region 104 includes a P-type doped body region, and second N-type region 106 includes a N-type source region. However, it should be appreciated that each of the layers may be formed having different doping levels.

Figure 4:
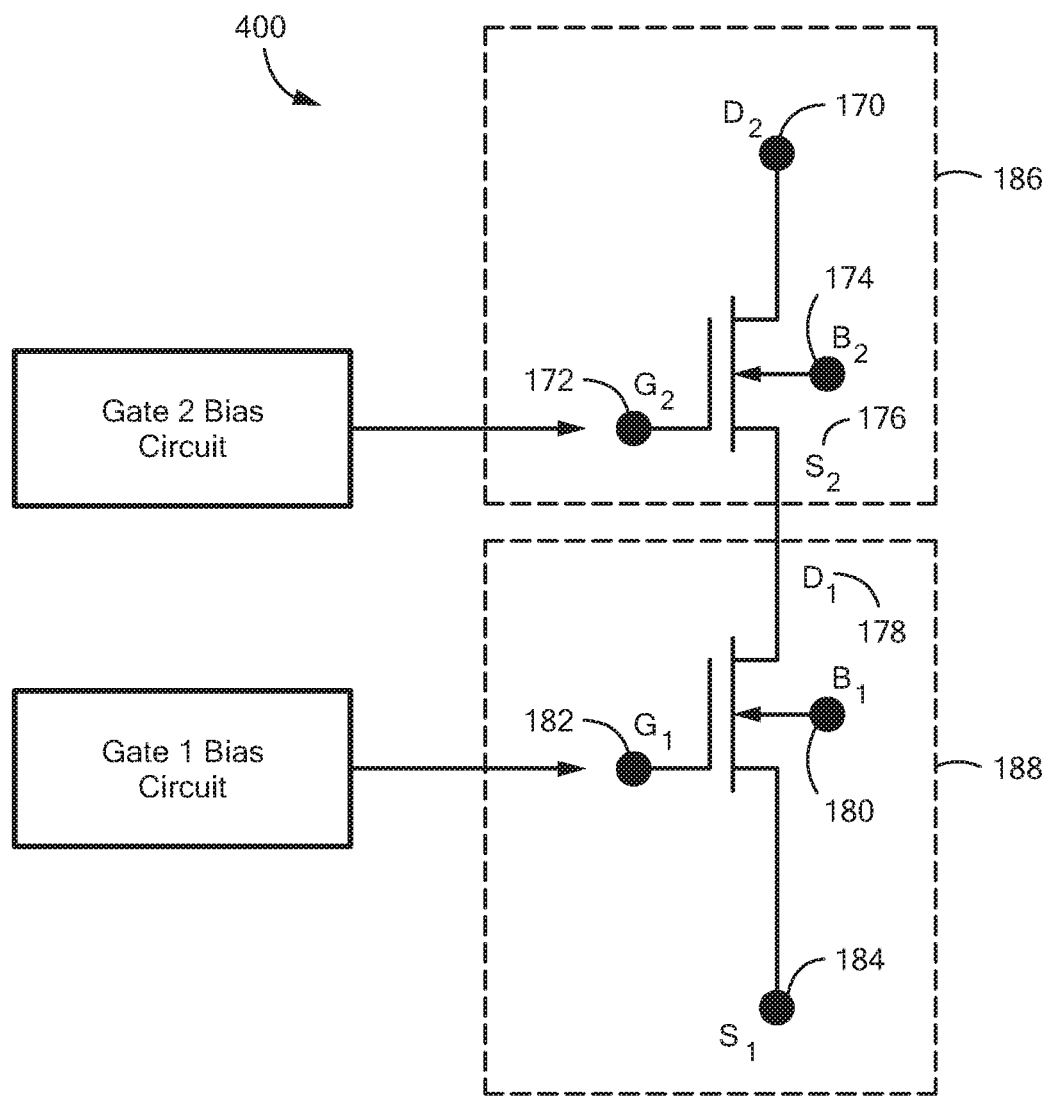
FIG. 4 is a schematic diagram of the terminals couplings of a trench isolation based cascaded NMOS transistor structure.

Now referring to FIG. 4, a first MOS transistor 186 is coupled to a second MOS transistor 188 to form a cascaded MOS transistor 400. For example, and as illustrated in FIG. 4, first MOS transistor 186 includes a first drain terminal 170, a first gate terminal 172, a first body terminal 174 and a first source terminal 176. Second MOS transistor 188 includes a second drain terminal 178, a second gate terminal 182, a second body terminal 184 and a second source terminal 184. In an embodiment, the first source terminal 176 of first MOS transistor 186 can be coupled to the second drain terminal 178 of second MOS transistor 188 to form the cascaded MOS transistor 400.

However, it should be appreciated that multiple MOS transistors can be coupled in a variety of different techniques to form a cascaded MOS transistor. For example, the gate terminals can be independently coupled to external sources of signal and thus controlled independently. The gate terminals can be coupled to the source terminals and/or the gate terminals can be coupled to the drain terminals to form cascaded MOS transistors. In some embodiments, the gate terminal of a second MOS transistor can be coupled to a source terminal of the second MOS transistor and a first gate bias can be applied to the gate terminal of a first MOS transistor to form a cascaded MOS transistor having an adjustable trigger voltage.

In one embodiment, a gate terminal of a second transistor structure may be coupled to a source terminal of the second transistor structure and a gate terminal of a first transistor structure may be coupled to a source terminal of the first transistor structure to form a stacked cascaded MOS transistor structure configured as grounded-gate MOS ESD clamp.

In an embodiment, the gate coupling on them may be direct, capacitive, or a combination of direct and capacitive (e.g., direct for one, capacitive for another). For example, a gate terminal of a second transistor structure may be capacitively coupled to a drain terminal of the second transistor structure and a gate terminal of a first transistor structure may be capacitively coupled to a drain terminal of the first transistor structure to from a stacked capacitor coupled cascaded MOS transistor. In some embodiments, a gate terminal of a second MOS transistor may be coupled to a second drain terminal of the second MOS transistor and a first gate terminal of a first MOS transistor may be capacitively coupled to a first drain terminal of the first MOS transistor to form a low-pass capacitor coupled cascaded MOS transistor.

Figure 5:
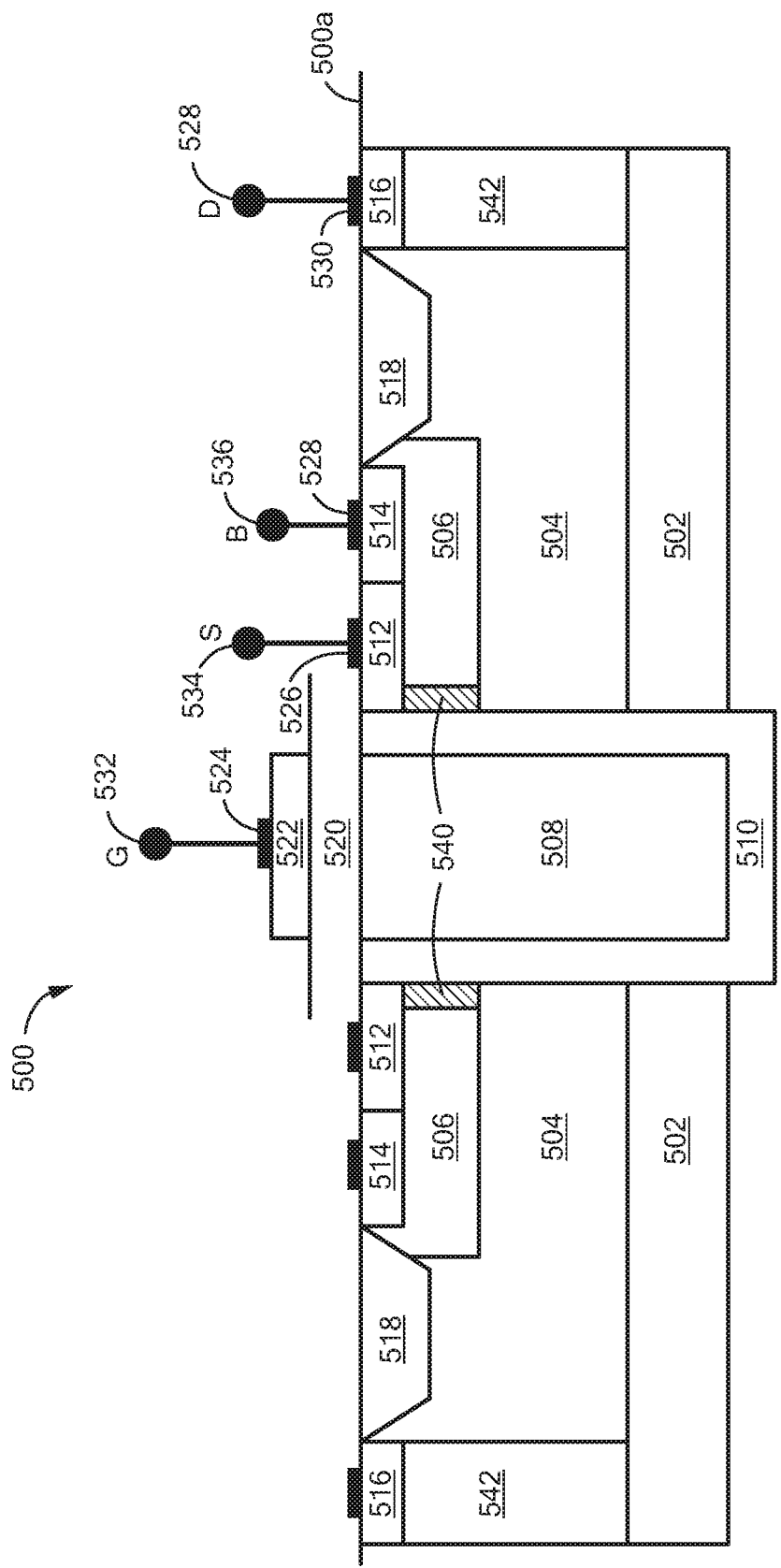
FIG. 5 is a block diagram of a second embodiment of a trench isolation based NMOS transistor structure having a capacitively coupled gate connection.

Now referring to FIG. 5, a transistor structure 500 includes a N-type buried layer 502, a first N-type region 504 extending into N-type buried layer 502, a first P-type region 506 extending into first N-type region 504, a second N-type region 512 extending into first P-type region 506 and a second P-type region 514 extending into first P-type region 506. Second N-type region 512 and second P-type region 514 may be formed along a first surface 500a of transistor 500.

A plug region 542 (e.g., N-type plug region) may be formed extending into N-type buried layer 502 and a third N-type region 516 may be formed extending into plug region 542 and along first surface 500a of transistor structure 500.

A field oxide region 518 may be formed along first surface 500a and between second P-type region 514 and third N-type region 516. Field oxide region 518 may include at least one of a shallow trench isolation (STI) region or a local oxidation of silicon (LOCOS) region. Field oxide region 518 may form a barrier between second N-type region 512/ second P-type region 514 and third N-type region 516. As will be discussed below, second N-type region 512, second P-type region 514 and third N-type region 516 may be coupled to a source terminal 534, a body terminal 536 and a drain terminal 538, respectively, of transistor 500. Thus, field oxide region 518 may be used to provide isolation between the source/body terminals 534, 536 of transistor 500 from the drain terminal 538.

A trench region 508 is formed in transistor 500 such that it extends through each of N-type buried layer 502, first N-type region 504, first P-type region 506 and second N-type region 512. A liner 510 is formed around trench region 508 such that it forms a barrier between trench region 508 and each of N-type buried layer 502, first N-type region 504, first P-type region 506 and second N-type region 512.

A dielectric layer 520 is formed over trench region 508 and a coupling electrode 522 is formed over dielectric layer 520. A first node 524 is formed over coupling electrode 522 and may be coupled to a gate terminal (G) 532. A second node 526 is formed over second N-type region 512 and may be coupled to a source terminal (S) 534. A third node 528 is formed over second P-type region 514 and may be coupled to body terminal (B) 536. A fourth node 530 is formed over third N-type region 516 and may be coupled to a drain terminal (D) 538.

In an embodiment, trench region 508 forms a gate electrode and liner 510 forms a gate dielectric of a parasitic metal-oxide semiconductor (MOS) type structure in transistor 500. Dielectric layer 520 and coupling electrode 522 form a capacitive coupling from trench region 508 to first node 524.

In some embodiments, gate terminal 532 may be coupled to drain terminal 538 to form an ESD clamp within transistor 500 and source terminal 534 may be coupled to body terminal 536.

In operation, responsive to a voltage applied to trench region 508, via dielectric layer 520 and coupling electrode 522, a channel region 540 is formed in first P-type region 506. Channel region 540 may provide a current path from second N-type region 512 to first N-type region 504 and N-type buried layer 502. The voltage may be greater than a voltage threshold of transistor 500 to form an electrostatic field inside first P-type region 506 and cause an inversion of the conductivity to second N-type region 512, first N-type region 504 and N-type buried layer 502.

In one embodiment of transistor 500, first N-type region 504 includes a N-type epitaxial region (N-EPI), first P-type region 506 includes a P-type well region, second N-type region 512 includes a N+ type region, second P-type region 514 includes a P+ type region, third N-type region 516 includes a N+ type region. However, it should be appreciated that each of the layers may be formed having different doping levels.

In some embodiments, an additional P-type region may be formed under first P-type region 506, thus channel 540 can be formed by inversion of first P-type region 506 and the additional P-type region.

Figure 6:
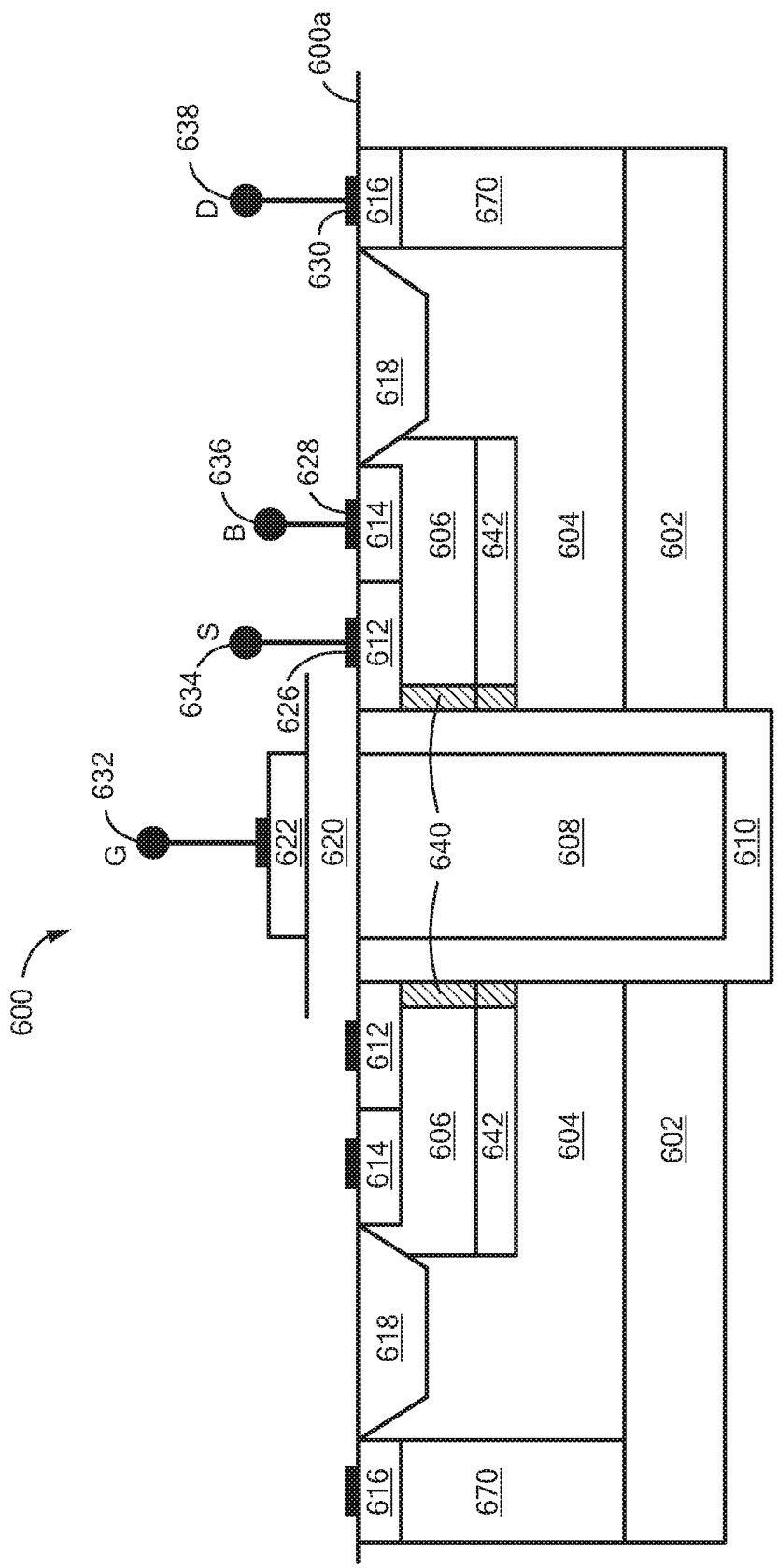
FIG. 6 is a block diagram of a third embodiment of a trench isolation based NMOS transistor structure having a capacitively coupled gate connection.

For example, and now referring to FIG. 6, a transistor structure 600 includes a N-type buried layer 602, a first N-type region 604 extending into N-type buried layer 602, a first P-type region 606 extending into first N-type region 604, a second N-type region 612 extending into first P-type region 606 and a second P-type region 614 extending into first P-type region 606. Second N-type region 612 and second P-type region 614 may be formed along a first surface 600a of transistor 600.

Transistor 600 may be similar to transistor 500 of FIG. 5, however transistor 600 includes a third P-type region 642 extending into first N-type region 604 and formed under first P-type region 606 such that it is disposed between first P-type region 606 and first N-type region 604. In an embodiment, third P-type region 642 may be formed having a doping level that is different than (i.e., greater than, less than) a doping level of first P-type region 606.

A plug region 670 (e.g., N-type plug region) may be formed extending into N-type buried layer 602 and a third N-type region 616 may be formed extending into plug region 670 and along first surface 600a of transistor structure 600. A field oxide region 618 may be formed along first surface 600a and between second P-type region 614 and third N-type region 616. Field oxide region 618 may include at least one of a shallow trench isolation (STI) region or a local oxidation of silicon (LOCOS) region. Field oxide region 618 may form a barrier between second N-type region 612/second P-type region 614 and third N-type region 616. Field oxide region 618 may be used to provide isolation between the source/body terminals 634, 636 of transistor 600 from the drain terminal 638.

A trench region 608 is formed in transistor 600 such that it extends through each of N-type buried layer 602, first N-type region 604, third P-type region 642, first P-type region 606, and second N-type region 612. A liner 610 is formed around trench region 608 such that it forms a barrier between trench region 608 and each of N-type buried layer 602, first N-type region 604, third P-type region 642, first P-type region 606 and second N-type region 612.

A dielectric layer 620 is formed over trench region 608 and a coupling electrode 622 is formed over dielectric layer 620. A first node 624 is formed over coupling electrode 622 and may be coupled to a gate terminal (G) 632. A second node 626 is formed over the second N-type region 612 and may be coupled to a source terminal (S) 634. A third node 628 is formed over the second P-type region 614 and may be coupled to a body terminal (B) 636. A fourth node 630 is formed over the third N-type region 616 and may be coupled to a drain terminal (D) 638.

In an embodiment, trench region 608 forms a gate electrode and liner 610 forms a gate dielectric of a parasitic metal-oxide semiconductor (MOS) type structure in transistor 600. Dielectric layer 620 and coupling electrode 622 form a capacitive coupling from trench region 608 to first node 624. In some embodiments, gate terminal 632 may be coupled to drain terminal 638 to form an ESD clamp within transistor 600.

Responsive to a voltage applied to trench region 608, via dielectric layer 620 and coupling electrode 622, a channel region 640 is formed in first P-type region 606 and third P-type region 642. Channel region 640 may provide a current path from second N-type region 612 to first N-type region 604 and N-type buried layer 602. The voltage may be greater than a voltage threshold of transistor 600 to form an electrostatic field inside first P-type region 606 and third P-type region 642, thus, causing an inversion of the conductivity to second N-type region 612, first N-type region 604 and N-type buried layer 602.

In one embodiment of transistor 600, first N-type region 604 includes a N-type epitaxial (N-EPI) region, first P-type region 606 includes a P-type well, second N-type region 612 includes a N+ type region, second P-type region 614 includes a P+ type region, third P-type region 642 includes a P-type region having a different doping level than first P-type region 606, and third N-type region 616 includes a N+ type region. However, it should be appreciated that each of the layers may be formed having different doping levels.

Figure 7:
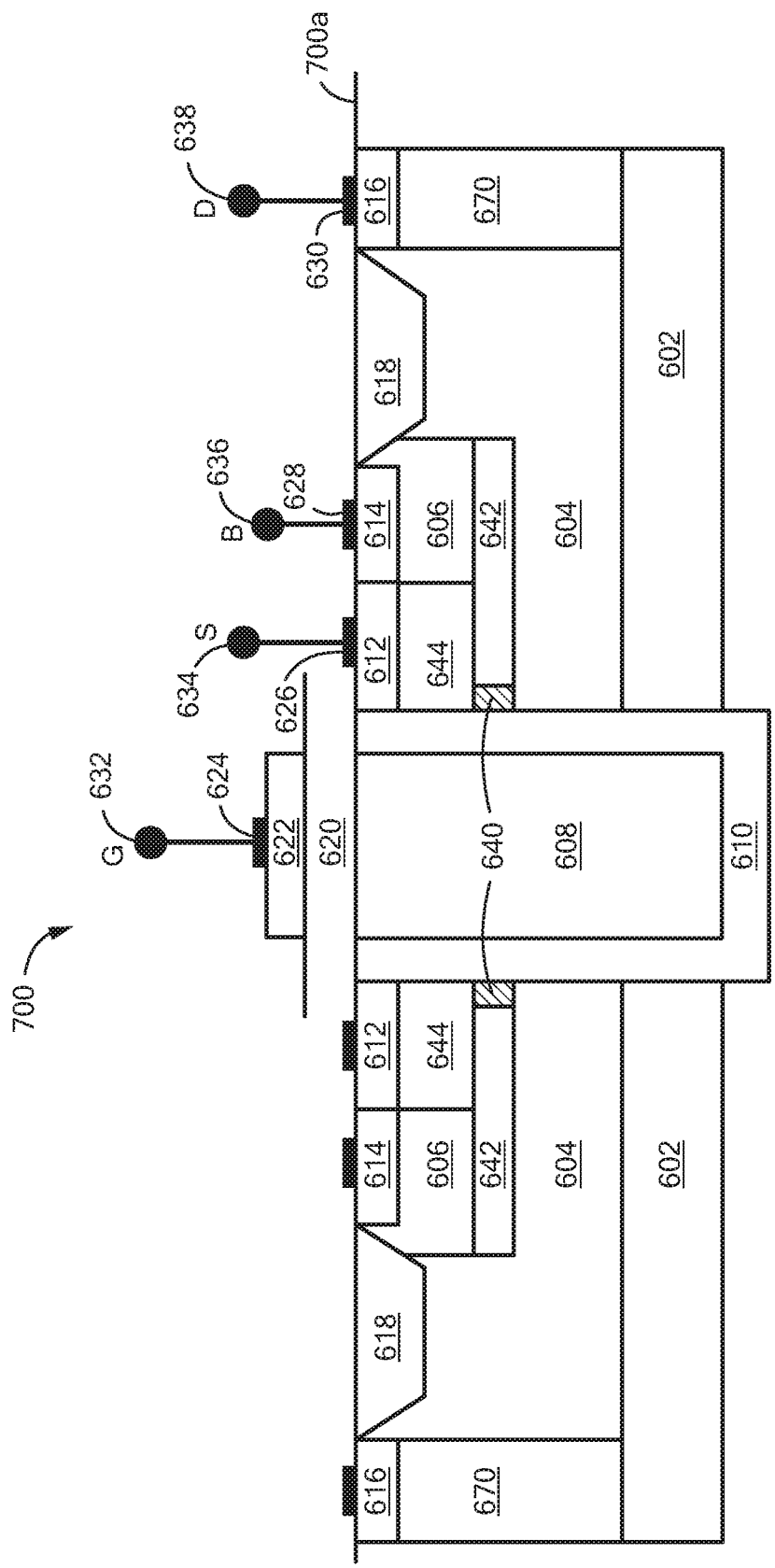
FIG. 7 is a block diagram of a fourth embodiment of a trench isolation based NMOS transistor structure having a capacitively coupled gate connection.

Now referring to FIG. 7, a transistor structure 700 is provided that is similar to transistor 600 of FIG. 6, however transistor 700 includes an additional N-type region 644 (hereinafter fourth N-type region 644) formed adjacent to first P-type region 606 and adjacent to liner 610. In one embodiment, fourth N-type region 644 may include a N-type well region. For example, fourth N-type region 644 is positioned between liner 610 and P-type region 606.

Responsive to a voltage applied to trench region 608, via dielectric layer 620 and coupling electrode 622, channel region 640 is formed in third P-type region 642. Channel region 640 may provide a current path from second N-type region 612 and fourth N-type region 644 to first N-type region 604 and N-type buried layer 602. The voltage may be greater than a voltage threshold of transistor 600 to form an electrostatic field inside third P-type region 642, thus, causing an inversion of the conductivity to second N-type region 612, fourth N-type region 644, first N-type region 604 and N-type buried layer 602 that are positioned over different surfaces of third P-type region 642.

In one embodiment of transistor 700, first N-type region 604 includes a N-type epitaxial (N-EPI) region, first P-type region 606 includes a P-type well, second N-type region 612 includes a N+ type region, second P-type region 614 includes a P+ type region, third P-type region 642 includes a P-type region having a different doping level than first P-type region 606, third N-type region 616 includes a N+ type region, and fourth N-type region 644 includes a N-type well region. However, it should be appreciated that each of the layers may be formed having different doping levels.

Figure 8:
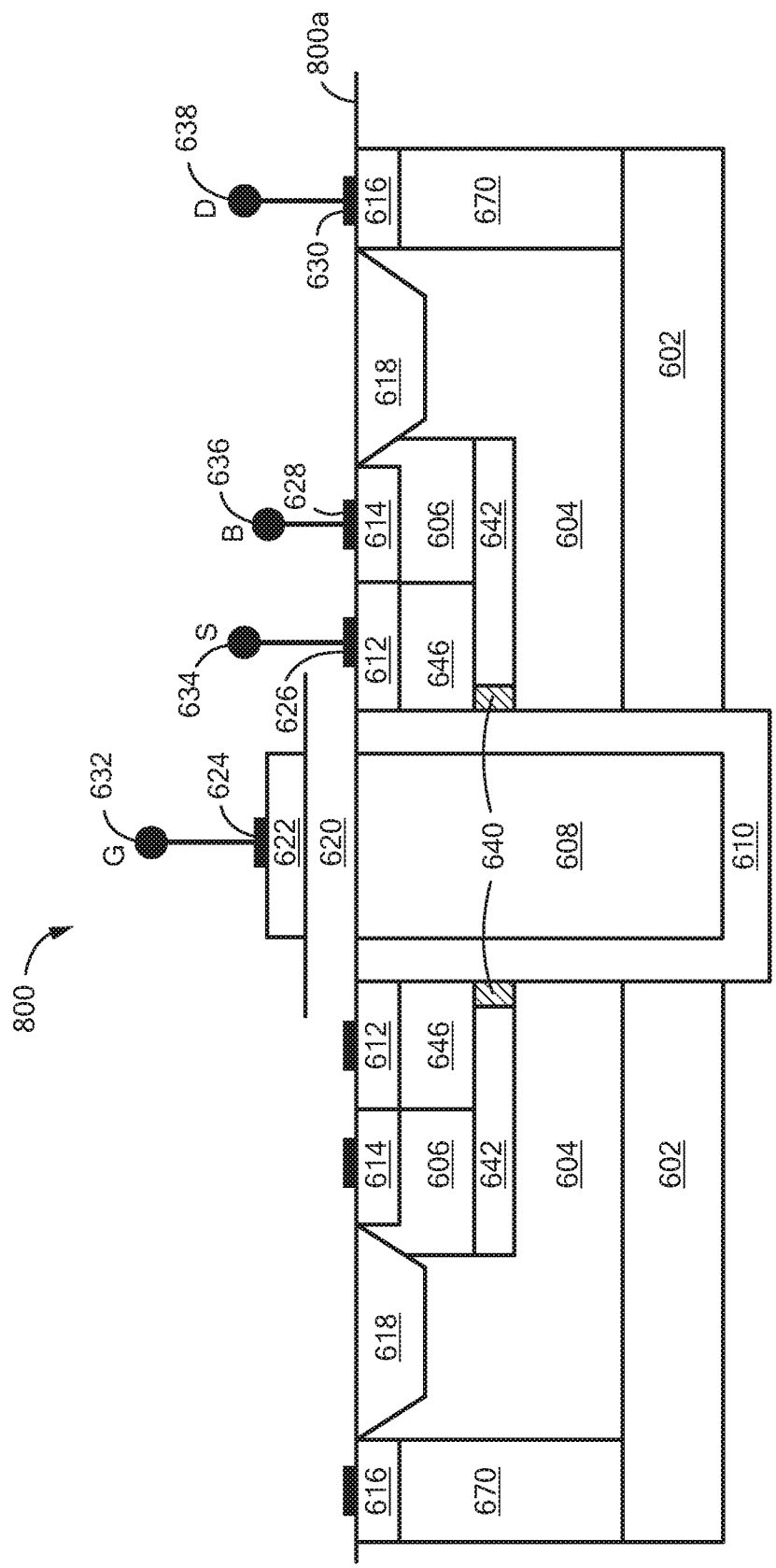
FIG. 8 is a block diagram of a fifth embodiment of a trench isolation based NMOS transistor structure having a capacitively coupled gate connection.
Figure 8A:
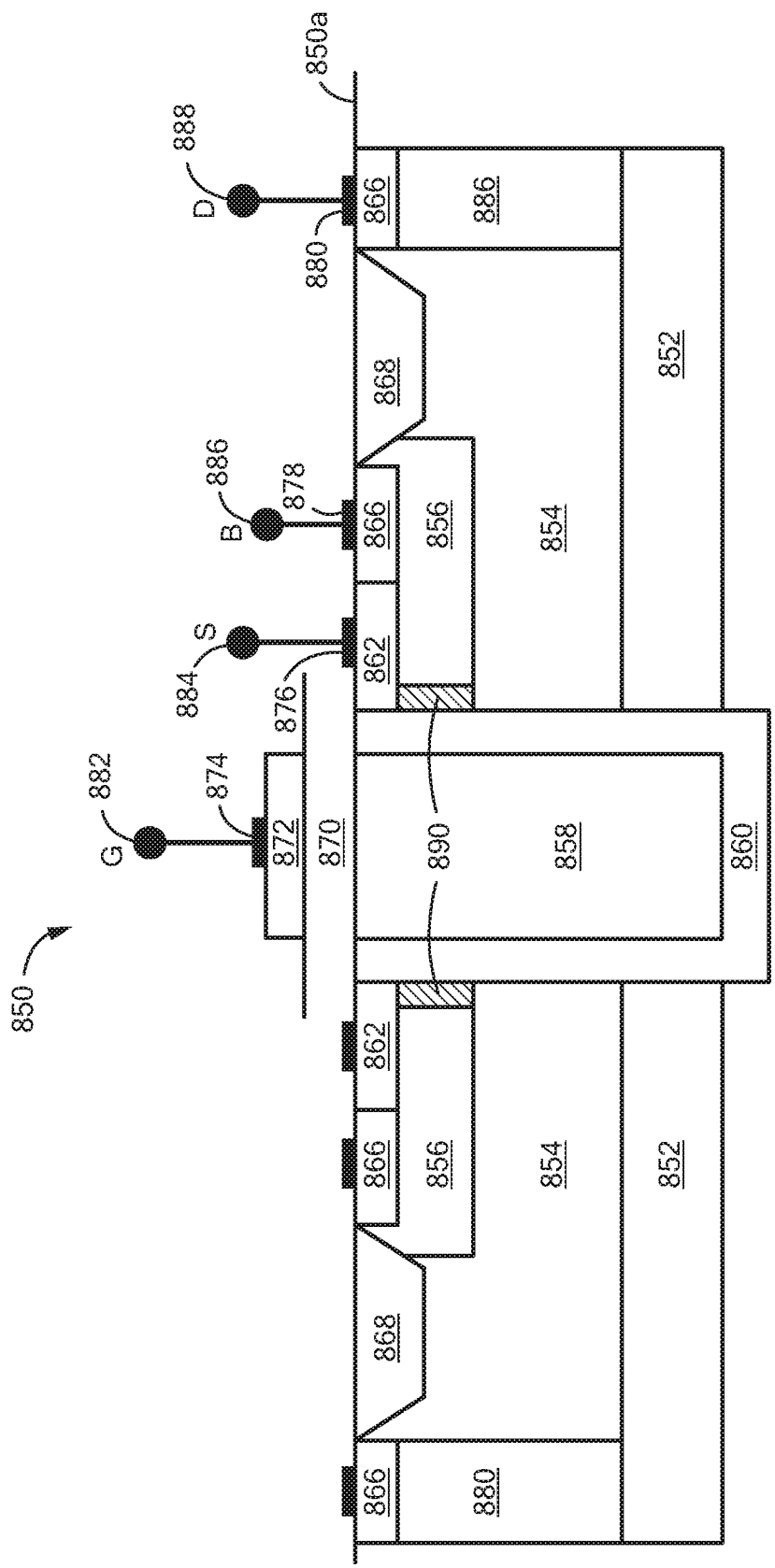
FIG. 8A is a block diagram of an embodiment of a trench isolation based P-type metal-oxide-semiconductor (PMOS) transistor structure having a capacitively coupled gate connection.

Now referring to FIG. 8, a transistor structure 800 is provided that is similar to transistor 700 of FIG. 7, however in transistor 800, a N-type region 646 (hereinafter fifth N-type region 646) is formed having a different doping level than fourth N-type region 644. For example, in one embodiment, fifth N-type region 646 may include a N-type epitaxial region and fourth N-type region 644 may include a N-type well region. Fifth N-type region 646 is formed adjacent to first P-type region 606 and adjacent to liner 610. Thus, the fifth N-type region 646 replaces fourth N-type region 644 of FIG. 7.

Responsive to a voltage applied to trench region 608, via dielectric layer 620 and coupling electrode 622, a channel region 640 is formed in third P-type region 642. Channel region 640 may provide a current path from second N-type region 612 and fifth N-type region 646 to first N-type region 604 and N-type buried layer 602. The voltage may be greater than a voltage threshold of transistor 600 to form an electrostatic field inside third P-type region 642, thus, causing an inversion of the conductivity to second N-type region 612, fifth N-type region 646, first N-type region 604 and N-type buried layer 602 that are positioned over different surfaces of third P-type region 642.

In one embodiment of transistor 800, first N-type region 604 includes a N-type epitaxial (N-EPI) region, first P-type region 606 includes a P-type well, second N-type region 612 includes a N+ type region, second P-type region 614 includes a P+ type region, third P-type region 642 includes a P-type region having a different doping level than first P-type region 606, third N-type region 616 includes a N+ type region, and fifth N-type region 646 includes a N-type epitaxial region. However, it should be appreciated that each of the layers may be formed having different doping levels.

In some embodiments, the transistor 500 described above with respect to FIG. 5 may be provided having a PMOS configuration. For example, and now referring to FIG. 8A, a transistor structure 850 includes a P-type buried layer 852, a first P-type region 854 extending into P-type buried layer 852, a first N-type region 856 extending into first P-type region 854, a second P-type region 862 extending into first N-type region 856 and a second N-type region 864 extending into first N-type region 856. Second P-type region 862 and second N-type region 864 may be formed along a first surface 850a of transistor 850.

A plug region 880 (e.g., P-type plug region) may be formed extending into P-type buried layer 852 and a third P-type region 866 may be formed extending into plug region 880 and along first surface 850a of transistor structure 850.

A field oxide region 868 may be formed along first surface 850a and between second N-type region 864 and third P-type region 866. Field oxide region 868 may include at least one of a shallow trench isolation (STI) region or a local oxidation of silicon (LOCOS) region. Field oxide region 868 may form a barrier between second P-type region 862/ second N-type region 864 and third P-type region 866. As will be discussed below, second P-type region 862, second N-type region 864 and third P-type region 866 may be coupled to a source terminal 884, body terminal 886 and drain terminal 888, respectively, of transistor 850. Thus, field oxide region 868 may be used to provide isolation between the source/body terminals 884, 886 of transistor 850 from drain terminal 888.

A trench region 858 is formed in transistor 850 such that it extends through each of P-type buried layer 852, first P-type region 854, first N-type region 856 and second P-type region 862. A liner 860 is formed around trench region 858 such that it forms a barrier between trench region 858 and each of P-type buried layer 852, first P-type region 854, first N-type region 856 and second P-type region 862.

A dielectric layer 870 is formed over trench region 858 and a coupling electrode 872 is formed over dielectric layer 870. A first node 874 is formed over coupling electrode 872 and may be coupled to a gate terminal (G) 882. A second node 876 is formed over second P-type region 862 and may be coupled to a source terminal (S) 884. A third node 878 is formed over second N-type region 864 and may be coupled to a body terminal (B) 886. A fourth node 880 is formed over third P-type region 866 and may be coupled to a drain terminal (D) 888.

In an embodiment, trench region 858 forms a gate electrode and liner 860 forms a gate dielectric of a parasitic metal-oxide semiconductor (MOS) type structure in transistor 850. Dielectric layer 870 and coupling electrode 872 form a capacitive coupling from trench region 858 to first node 874.

In some embodiments, gate terminal 882 may be coupled to drain terminal 888 to form an ESD clamp within transistor 850.

Responsive to a voltage applied to trench region 858, via dielectric layer 870 and coupling electrode 872, a channel region 890 is formed in first N-type region 856. Channel region 890 may provide a current path from second P-type region 862 to first P-type region 854 and P-type buried layer 852. The voltage may be greater than a voltage threshold of transistor 850 to form an electrostatic field inside first N-type region 856 and cause an inversion of the conductivity to second P-type region 862, first P-type region 854 and P-type buried layer 852.

In one embodiment of transistor 850, first P-type region 854 includes a P-type epitaxial region, first N-type region 856 includes a N-type well region, second P-type region 862 includes a P+ region, second N-type region 864 includes a N+ region, and third P-type region 866 includes a P+ region. However, it should be appreciated that each of the layers may be formed having different doping levels.

Figure 9:
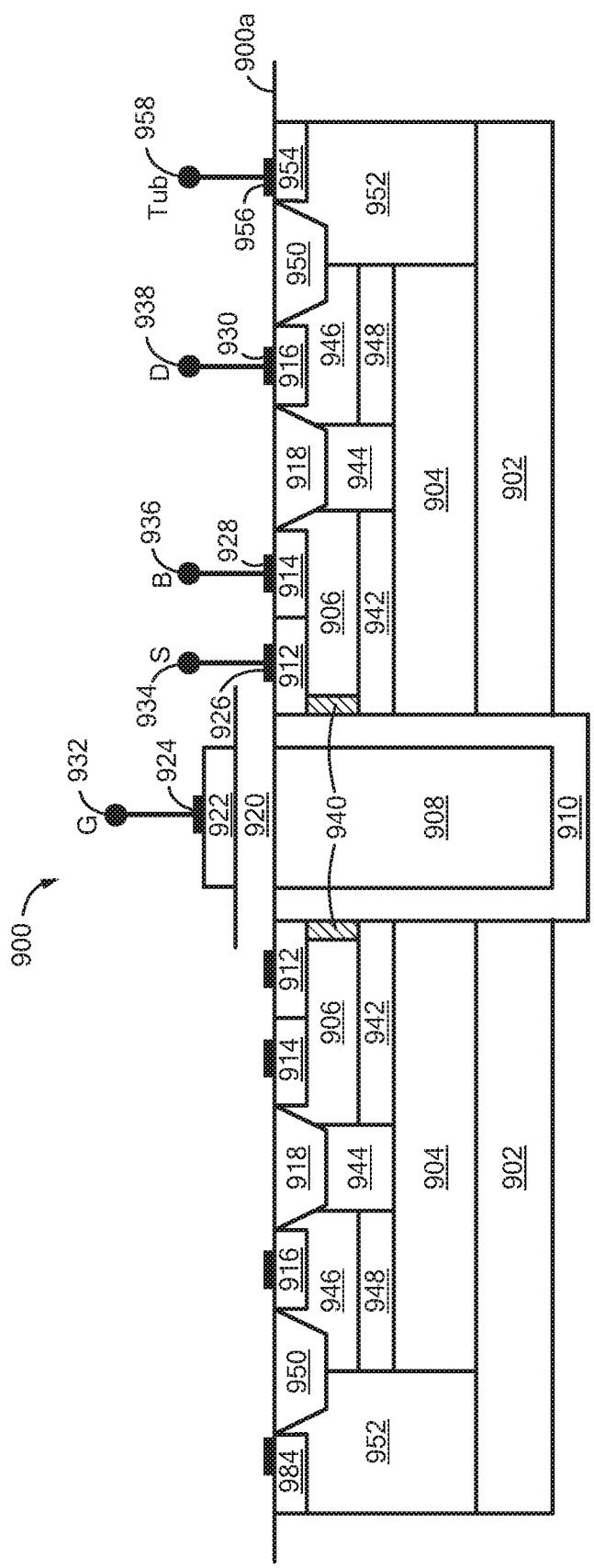
FIG. 9 is a block diagram of a second embodiment of a trench isolation based PMOS transistor structure having a capacitively coupled gate connection.

FIG. 9, a transistor structure 900 includes a N-type buried layer 902, a P-type buried layer 904 formed over a first surface 902a of N-type buried layer 902 and a plug region 952 formed over first surface 902a. A first P type region 942 is formed over a first surface 904a of P-type buried layer 904, a third N-type region 944 is formed over first surface 904a and a third P-type region 948 is formed over first surface 904a. A first N-type region 906 is formed over a first surface 942a of first P-type region 942 and a fourth P-type region 946 is formed over a first surface 948a of third P-type region 948. First N-type region 906 and fourth P-type region 946 are formed on opposites sides of third N-type region 944.

A second P-type region 912 is formed over a first surface 906a of first N-type region 906 and a second N-type region 914 is formed over first surface 906a. A fifth P-type region 916 is formed over a first surface 946a of fourth P-type region 946 and a fourth N-type region 954 is formed over a first surface 952a of plug region 952.

A first field oxide region 918 is formed over a first surface 944a of third N-type region 944 and is positioned between second N-type region 914 and fifth P-type region 916. In an embodiment, first field oxide region 918 can be formed such that portions of first field oxide region 918 extend into first N-type region 906, third N-type region 944 and fourth P-type region 946. First field oxide region 918 may be provided as an isolation barrier between second N-type region 914 and fifth P-type region 916.

A second field oxide region 950 is formed such that portions of second field oxide region 950 extend into fourth P-type region 946 and plug region 952. Second field oxide region 950 is positioned between fifth P-type region 916 and fourth N-type region 954. In an embodiment, second field oxide region 950 may be provided as an isolation barrier between fifth P-type region 916 and fourth N-type region 954.

First and second field oxide regions 918, 950 may include at least one of a shallow trench isolation (STI) region or a local oxidation of silicon (LOCOS) region.

A trench region 908 is formed in transistor 900 such that it extends through each of N-type buried layer 902, P-type buried layer 904, first P-type region 942, first N-type region 906 and second P-type region 912. A liner 910 is formed around trench region 908 such that it forms a barrier between trench region 908 and each of N-type buried layer 902, P-type buried layer 904, first P-type region 942, first N-type region 906 and second P-type region 912.

A dielectric layer 920 is formed over a first surface 902a of trench region 608 and a coupling electrode 922 is formed over first surface 920a of dielectric layer 920.

Each of second P-type region 912, second N-type region 914, first field oxide region 918, fifth P-type region 916, second field oxide region 950 and fourth N-type region 954 may be formed along a first surface 900a of transistor 900.

A first node 924 is formed over a first surface 922a of coupling electrode 922 and may be coupled to a gate terminal (G) 932. A second node 926 is formed over a first surface 912a of second P-type region 912 and may be coupled to a source terminal (S) 934. A third node 928 is formed over a first surface 914a of second N-type region 914 and may be coupled to a body terminal (B) 936. A fourth node 930 is formed over a first surface 916a of fifth P-type region 916 and may be coupled to a drain terminal (D) 938. A fifth node 956 is formed over a first surface 954a of fourth N-type region 954 and may be coupled to a tub terminal 958.

In an embodiment, trench region 908 forms a gate electrode and liner 910 forms a gate dielectric of a parasitic metal-oxide semiconductor (MOS) type structure in transistor 900. Dielectric layer 920 and coupling electrode 922 form a capacitive coupling from trench region 908 to first node 924. In some embodiments, gate terminal 932 may be coupled to source terminal 934 to form an ESD clamp within transistor 900 (here a PMOS transistor structure).

Responsive to a voltage applied to trench region 908, via dielectric layer 920 and coupling electrode 922, a channel region 940 is formed in the first N-type region 906. Channel region 940 may provide a current path from second P-type region 912 to first P-type region 942 and P-type buried layer 904. The voltage may be greater than a voltage threshold of transistor 900 to form an electrostatic field inside the first N-type region 906, thus, causing an inversion of the conductivity to second P-type region 912, first P-type region 942 and P-type buried layer 904.

In an embodiment, N-type buried layer 902 and plug region 952 (e.g., N-type plug region) may form a continuous n-type well (e.g., tub) that contains and/or electrically isolates transistor 900. For example, in applications in which transistor 900 is implemented near or around additional circuitry, N-type buried layer 902 and plug region 952 may form an isolation barrier (e.g., a wrapper) around transistor 900 to electrically isolate transistor 900 from the additional circuitry.

In an embodiment, N-type buried layer 902 and plug region 952 can be biased separately (separately from trench region 908) to form the isolation barrier around the ESD clamp (here a PMOS ESD clamp) from the P-type substrate.

In one embodiment of transistor 900, first P type region 942 includes a P-type region having a different doping level than P-type buried layer 904, third N-type region 944 includes a N-type epitaxial region, third P-type region 948 a P-type region having a different doping level than P-type buried layer 904 and fourth P-type region 946, first N-type region 906 includes a N-type well region, fourth P-type region 946 includes a P-type well region, second P-type region 912 includes a P+ type region, second N-type region 914 includes a N+ type region, fifth P-type region 916 includes a P+ type region, and fourth N-type region 954 includes a N+ type region. However, it should be appreciated that each of the layers may be formed having different doping levels.

Figure 10:
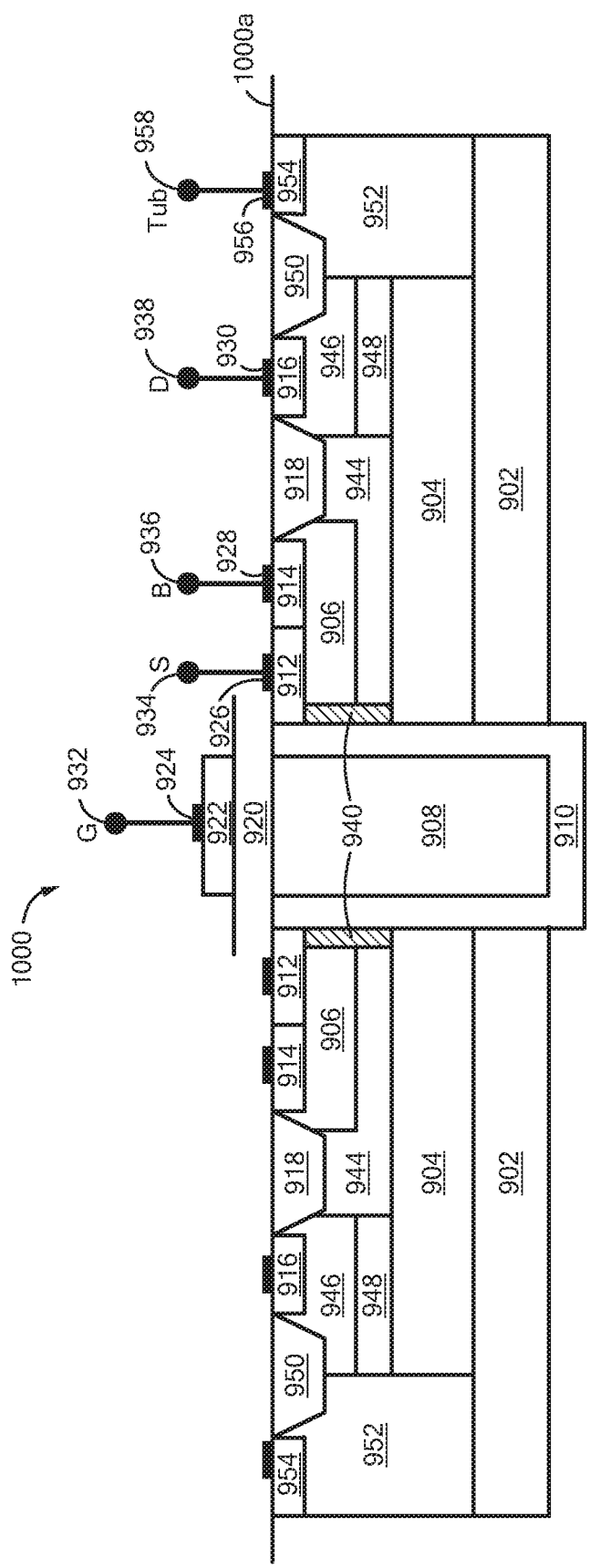
FIG. 10 is a block diagram of a third embodiment of a trench isolation based PMOS transistor structure having a capacitively coupled gate connection.

Now referring to FIG. 10, a transistor structure 1000 is provided that is similar to transistor 900 of FIG. 9, however in transistor 1000, first P-type region 942 is removed or otherwise not formed and replaced by an increased third N-type region 944. For example, and as illustrated in FIG. 10, third N-type region 944 extends to liner 910 such that it is disposed between liner 910 on a first side and fourth P-type region 946 and third P-type region 948 on a second side.

In operation, responsive to a voltage applied to trench region 908, via dielectric layer 920 and coupling electrode 922, a channel region 940 is formed in portions of first N-type region and 906 and third N-type region 944 adjacent to liner 910. Channel region 940 may provide a current path from second P-type region 912 to P-type buried layer 904. The voltage may be greater than a voltage threshold of transistor 1000 to form an electrostatic field inside first N-type region 906 and third N-type region 944, thus, causing an inversion of the conductivity to second P-type region 912 to P-type buried layer 904.

In one embodiment of transistor 1000, third N-type region 944 includes a N-type epitaxial region, third P-type region 948 a P-type region having a different doping level than P-type buried layer 904 and fourth P-type region 946, first N-type region 906 includes a N-type well region, fourth P-type region 946 includes a P-type well region, second P-type region 912 includes a P+ type region, second N-type region 914 includes a N+ type region, fifth P-type region 916 includes a P+ type region, and fourth N-type region 954 includes a N+ type region. However, it should be appreciated that each of the layers may be formed having different doping levels.

Figure 11:
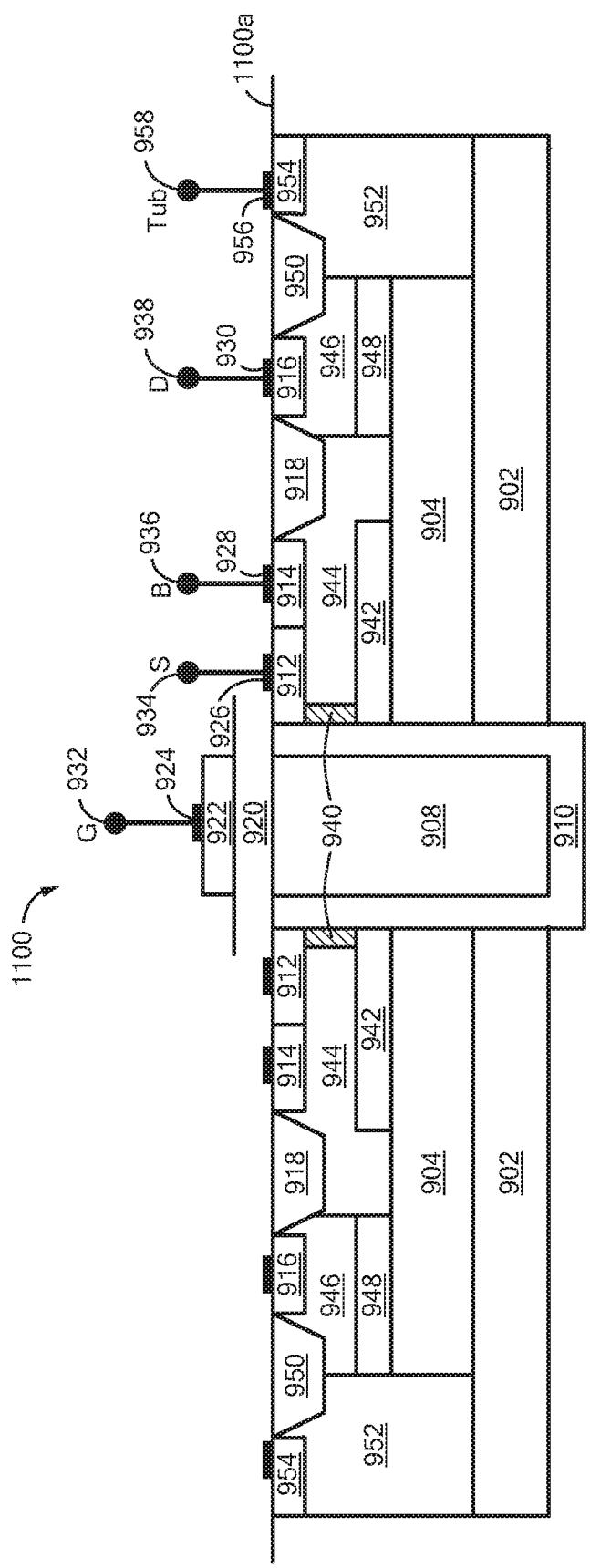
FIG. 11 is a block diagram of a fourth embodiment of a trench isolation based PMOS transistor structure having a capacitively coupled gate connection.

Now referring to FIG. 11, a transistor structure 1100 is provided that is similar to transistor 900 of FIG. 9, however in transistor 1100, first N-type region 906 is replaced by third N-type region 944. Thus, third N-type region 944 is disposed over a first surface 942a of first P-type region 942 and a second, different portion of third N-type region 944 is disposed over a first surface 904a of P-type buried layer 904 such that the N-type epitaxial layer 944 extends from liner 910 to third and fourth P-type regions 948, 946 respectively.

Responsive to a voltage applied to trench region 908, via dielectric layer 920 and coupling electrode 922, channel region 940 is formed in third N-type region 944. Channel region 940 may provide a current path from second P-type region 912 to first P-type region 942 and P-type buried layer 904. In an embodiment, channel 940 as formed in transistor 1100 may be smaller than channel 940 formed in transistor 1000 due to the arrangement of regions in transistor 1100.

The voltage may be greater than a voltage threshold of transistor 1100 to form an electrostatic field inside third N-type region 944, thus, causing an inversion of the conductivity from second P-type region 912 to first P-type region 942 and P-type buried layer 904.

In one embodiment of transistor 1100, first P type region 942 includes a P-type region having a different doping level than P-type buried layer 904, third N-type region 944 includes a N-type epitaxial region, third P-type region 948 a P-type region having a different doping level than P-type buried layer 904 and fourth P-type region 946, fourth P-type region 946 includes a P-type well region, second P-type region 912 includes a P+ type region, second N-type region 914 includes a N+ type region, fifth P-type region 916 includes a P+ type region, and fourth N-type region 954 includes a N+ type region. However, it should be appreciated that each of the layers may be formed having different doping levels.

Figure 12:
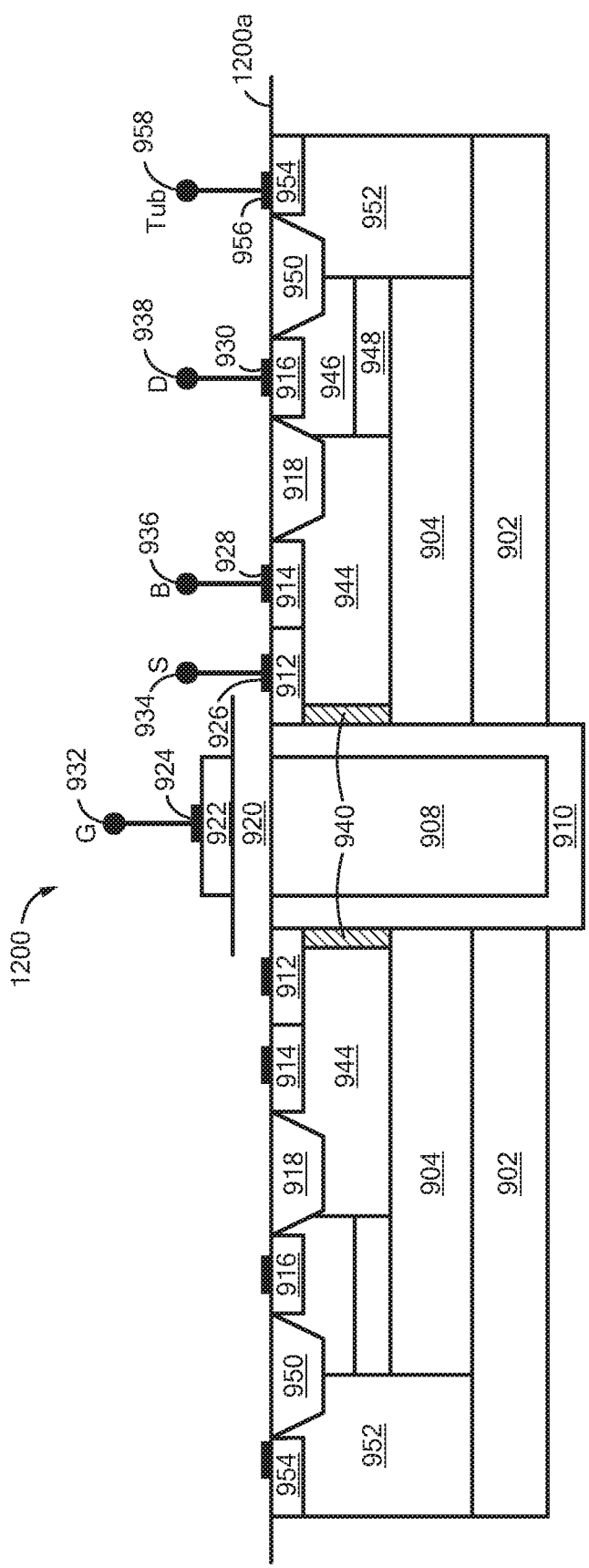
FIG. 12 is a block diagram of a fifth embodiment of a trench isolation based PMOS transistor structure having a capacitively coupled gate connection.

Now referring to FIG. 12, a transistor structure 1200 is provided that is similar to transistor 900 of FIG. 9, however in transistor 1200, first N-type region 906 and first P-type region 942 are replaced by third N-type region 944. Thus, third N-type region 944 is disposed over a first surface 904a of P-type buried layer 904 such that third N-type region 944 extends from liner 910 to third P-type region 948 and fourth P-type region 946.

In operation, responsive to a voltage applied to trench region 908, via dielectric layer 920 and coupling electrode 922, channel region 940 is formed in N-type epitaxial layer 944. Channel region 940 may provide a current path from second P-type region 912 to P-type buried layer 904. The voltage may be greater than a voltage threshold of transistor 1200 to form an electrostatic field inside a portion of third N-type region 944 adjacent to liner 910, thus, causing an inversion of the conductivity from second P-type region 912 to P-type buried layer 904.

In one embodiment of transistor 1200, third N-type region 944 includes a N-type epitaxial region, third P-type region 948 a P-type region having a different doping level than P-type buried layer 904 and fourth P-type region 946, fourth P-type region 946 includes a P-type well region, second P-type region 912 includes a P+ type region, second N-type region 914 includes a N+ type region, fifth P-type region 916 includes a P+ type region, and fourth N-type region 954 includes a N+ type region. However, it should be appreciated that each of the layers may be formed having different doping levels.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:

1. A transistor structure comprising:
   a first doped region;
   a second doped region extending into the first doped region;
   a third doped region extending into the second doped region;
   a trench region extending into the first doped region, the second doped region, and the third doped region;
   a liner disposed between the trench region and each of the first doped region, the second doped region, and the third doped region; and
   a channel region formed in the second doped region, responsive to a voltage applied to the trench region, the channel providing a current path from the first doped region to the third doped region;
   wherein the liner has a first surface and a second surface, the first surface in contact with the trench region and wherein the channel region is formed adjacent to the second surface;
   multiple horizontal MOS transistor structures or multiple vertical MOS transistor structures adjacent to the same portion of the second surface of the liner that form a cascaded MOS transistor structure; and
   wherein the cascaded MOS structure forms one or more electrostatic discharge (ESD) clamps included within a circuit arrangement, wherein the circuit arrangement is disposed between a first ESD clamp of the one or more ESD clamps such that a first terminal of the first ESD clamp is coupled to an input of the circuit arrangement and a first terminal of a second ESD clamp is coupled to an output of the circuit arrangement.

2. The transistor structure of claim 1, wherein:
   the first doped region comprises a first N-type region;
   the second doped region comprises a first P-type region extending into the first N-type region;
   the third doped region comprises a second N-type region extending into the first P-type region;
   the trench region extending into the second N-type region, the first P-type region, and the first N-type region;
   the liner disposed between the trench region and each of the second N-type region, the first P-type region, and the first N-type region; and
   the channel region formed in the first P-type region, responsive to a voltage applied to the trench region, the channel providing a current path from the second N-type region to the first N-type region.

3. The transistor structure of claim 2, further comprising:
   a first node formed over the trench region;
   a second node formed over the second N-type region;
   a third node formed over the first P-type region; and
   a fourth node formed over the first N-type region.

4. The transistor structure of claim 3, further comprising:
   a fourth doped region comprises a second P-type region extending into the first N-type region; and
   a fifth doped region comprises a third N-type region extending into the second P-type region.

5. The transistor structure of claim 4, further comprising:
   a fifth node formed over the first N-type region;
   a sixth node formed over second P-type region; and
   a seventh node formed over the third N-type region.

6. The transistor structure of claim 5, wherein the fifth node is coupled to a second source terminal, wherein the sixth node is coupled to a second body terminal, and wherein the seventh node is coupled to a second drain terminal.

7. The transistor structure of claim 6, wherein the drain of a first MOS transistor is coupled to the source of a second MOS transistor.

8. The transistor structure of claim 6, wherein the source of a first MOS transistor is coupled to the drain of a second MOS transistor.

9. The transistor structure of claim 4, wherein multiple channel regions are formed responsive to a gate bias applied to the trench region.

10. The transistor structure of claim 9, wherein a first channel region is formed in the first P-type region and a second channel region is formed in the second P-type region, wherein the first channel region provides a first current path from the second N-type region to the first N-type region and the second channel region provides a second current path from the first N-type region to the third N-type region.

11. A transistor structure comprising:
a first doped region;
a second doped region extending into the first doped region;
a third doped region extending into the second doped region;
a trench region extending into the first doped region, the second doped region, and the third doped region;
a liner disposed between the trench region and each of the first doped region, the second doped region, and the third doped region; and
a channel region formed in the second doped region, responsive to a voltage applied to the trench region, the channel providing a current path from the first doped region to the third doped region;
wherein the transistor structure comprises an electrostatic discharge (ESD) clamp; and
wherein a source terminal of a first MOS transistor structure is coupled to a drain terminal of a second MOS transistor structure to form a cascaded MOS transistor structure.

12. The transistor structure of claim 11, wherein:
the first doped region comprises a first N-type region;
the second doped region comprises a first P-type region extending into the first N-type region;
the third doped region comprises a second N-type region extending into the first P-type region;
the trench region extending into the second N-type region, the first P-type region, and the first N-type region;
the liner disposed between the trench region and each of the second N-type region, the first P-type region, and the first N-type region; and
the channel region formed in the first P-type region, responsive to a voltage applied to the trench region, the channel providing a current path from the second N-type region to the first N-type region.

13. The transistor structure of claim 12, further comprising:
a fourth doped region comprises a second P-type region extending into the first N-type region; and
a fifth doped region comprises a third N-type region extending into the second P-type region.

14. The transistor structure of claim 13, further comprising:
a first node formed over the trench region;
a second node formed over the second N-type region;
a third node formed over the first P-type region;
a fourth node formed over the first N-type region;
a fifth node formed over the first N-type region;
a sixth node formed over second p-type region; and
a seventh node formed over the third n-type region.

15. The transistor structure of claim 14, wherein the fifth node is coupled to a second source terminal, wherein the sixth node is coupled to a second body terminal, and wherein the seventh node is coupled to a second drain terminal.

16. The transistor structure of claim 15, wherein the drain of the first MOS transistor structure is coupled to the source of the second MOS transistor structure.

17. An apparatus comprising:
a first doped region;
a second doped region extending into the first doped region;
a third doped region extending into the second doped region;
a trench region extending into the first doped region, the second doped region, and the third doped region;
a liner disposed between the trench region and each of the first doped region, the second doped region, and the third doped region; and
means for providing a current path from the first doped region to the third doped region;
wherein the liner has a first surface and a second surface, the first surface in contact with the trench region and wherein the means for providing a current path is formed adjacent to the second surface;
means for forming multiple horizontal MOS transistor structures or multiple vertical MOS transistor structures adjacent to the same portion of the second surface of the liner to form cascaded MOS transistor structures; and
wherein the transistor structure comprises an electrostatic discharge (ESD) clamp, and wherein a source terminal of a first MOS transistor structure is coupled to a drain terminal of a second MOS transistor structure to form a cascaded MOS transistor structure.

18. The apparatus of claim 17, wherein:
the first doped region comprises a first N-type region;
the second doped region comprises a first P-type region extending into the first N-type region;
the third doped region comprises a second N-type region extending into the first P-type region,
the apparatus further comprising:
a fourth doped region comprising a second P-type region extending into a first N-type region;
a fifth doped region comprising a third N-type region extending into the second P-type region; and
means for providing a current path from the third doped region to the fifth doped region.

19. A transistor structure comprising:
a first doped region comprising a first N-type region;
a second doped region comprising a first P-type region extending into the first doped region;
a third doped region comprising a second N-type region extending into the second doped region;
a trench region extending into the first doped region, the second doped region, and the third doped region;
a liner disposed between the trench region and each of the first doped region, the second doped region, and the third doped region; and
a channel region formed in the second doped region, responsive to a voltage applied to the trench region, the channel providing a current path from the first doped region to the third doped region;
wherein the liner has a first surface and a second surface, the first surface in contact with the trench region and wherein the channel region is formed adjacent to the second surface;
multiple horizontal MOS transistor structures or multiple vertical MOS transistor structures adjacent to the same portion of the second surface of the liner that form a cascaded MOS transistor structure;
a first node formed over the trench region;
a second node formed over the second N-type region;
a third node formed over the first P-type region; and
a fourth node formed over the first N-type region.

20. An apparatus comprising:
a first doped region;
a second doped region extending into the first doped region;
a third doped region extending into the second doped region;
a trench region extending into the first doped region, the second doped region, and the third doped region;

a liner disposed between the trench region and each of the first doped region, the second doped region, and the third doped region; and means for providing a current path from the first doped region to the third doped region; wherein the liner has a first surface and a second surface, the first surface in contact with the trench region and wherein the means for providing a current path is formed adjacent to the second surface; and means for forming multiple horizontal MOS transistor structures or multiple vertical MOS transistor structures adjacent to the same portion of the second surface of the liner to form cascaded MOS transistor structures;

a fourth doped region comprises a second P-type region extending into a first N-type region;

a fifth doped region comprises a third N-type region extending into the second P-type region; and means for providing a current path from the third doped region to the fifth doped region.

* * * * *

UNITED STATES PATENT AND TRADEMARK OFFICE
CERTIFICATE OF CORRECTION

PATENT NO.       : 10,943,976 B2
APPLICATION NO.  : 16/537725
DATED            : March 9, 2021
INVENTOR(S)      : Sundar Chetlur et al.

Page 1 of 2

It is certified that error appears in the above-identified patent and that said Letters Patent is hereby corrected as shown below:

On the Title Page

Item (57) Abstract, Line 6 delete "of trench" and replace with --of the trench--.

In the Specification

Column 1, Line 35 delete "of trench" and replace with --of the trench--.

Column 5, Line 51 delete "each the" and replace with --each of the--.

Column 7, Line 23 delete "includes" and replace with --include--.

Column 7, Line 49 delete "terminals" and replace with --terminal--.

Column 8, Line 61 delete "of trench" and replace with --of the trench--.

Column 10, Line 56 delete "from" and replace with --form--.

Column 11, Line 65 delete "though" and replace with --through--.

Column 12, Line 28 delete "element may" and replace with --elements may--.

Column 14, Line 6 delete "from" and replace with --form--.

Column 19, Line 59 delete "n-type" and replace with --N-type--.

Column 20, Line 29 delete "and 906" and replace with --906--.

Signed and Sealed this
Nineteenth Day of April, 2022

Katherine Kelly Vidal
*Director of the United States Patent and Trademark Office*

In the Claims

Column 23, Line 51 delete "p-type" and replace with --P-type--.

Column 23, Line 52 delete "n-type" and replace with --N-type--.